(12) United States Patent
Xhafa et al.

(10) Patent No.: US 12,372,579 B2
(45) Date of Patent: Jul. 29, 2025

(54) METHODS, APPARATUS, AND ARTICLES OF MANUFACTURE TO IMPROVE ONE-HOP EXTENSION IN WIRELESS BATTERY MANAGEMENT SYSTEMS

(71) Applicant: Texas Instruments Incorporated, Dallas, TX (US)

(72) Inventors: Ariton Xhafa, Plano, TX (US); Jyothsna Kunduru, Plano, TX (US); Minghua Fu, Plano, TX (US); Jonathan Nafziger, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 463 days.

(21) Appl. No.: 17/977,906

(22) Filed: Oct. 31, 2022

(65) Prior Publication Data

US 2024/0142523 A1 May 2, 2024

(51) Int. Cl.
| | |
|---|---|
| *G01R 31/36* | (2020.01) |
| *H04L 67/12* | (2022.01) |
| *H04W 28/10* | (2009.01) |
| *B60R 16/023* | (2006.01) |
| *B60R 16/033* | (2006.01) |
| *H01M 10/42* | (2006.01) |

(52) U.S. Cl.
CPC ............ *G01R 31/36* (2013.01); *H04L 67/12* (2013.01); *H04W 28/10* (2013.01); *B60R 16/0232* (2013.01); *B60R 16/033* (2013.01); *H01M 10/42* (2013.01)

(58) Field of Classification Search
USPC ........................................... 702/63
See application file for complete search history.

(56) References Cited

U.S. PATENT DOCUMENTS

| | | | |
|---|---|---|---|
| 11,145,908 B1* | 10/2021 | Deng .................. | H01M 10/425 |
| 11,165,263 B2 | 11/2021 | Sung et al. | |
| 2011/0258471 A1* | 10/2011 | Daniel ..................... | H04Q 9/00 |
| | | | 713/340 |
| 2014/0347014 A1* | 11/2014 | Lee ........................ | H02J 7/0047 |
| | | | 320/134 |
| 2017/0285113 A1* | 10/2017 | Hsiao ................... | G01R 31/378 |
| 2020/0229206 A1* | 7/2020 | Badic ..................... | G05D 1/225 |
| 2021/0037457 A1* | 2/2021 | Li ...................... | H04W 52/0203 |
| 2021/0242508 A1* | 8/2021 | Millen ................. | H04L 63/123 |

(Continued)

*Primary Examiner* — Paul D Lee
(74) *Attorney, Agent, or Firm* — Carl G. Peterson; Frank D. Cimino

(57) ABSTRACT

Methods, apparatus, systems, and articles of manufacture are disclosed to improve one-hop extension in wireless battery management systems. An example apparatus is to cause transmission of an instruction to a first battery monitoring node (BMN) of a vehicle, the first BMN in communication with the apparatus, the instruction to cause the first BMN to operate as a repeater for a second BMN of the vehicle, the second BMN noncommunicative with the apparatus. The example apparatus is to process an acknowledgement from the first BMN indicating that the first BMN has configured to operate as the repeater. Additionally, the example apparatus is to cause transmission of a communication to at least the first BMN indicating a time at which at least the first BMN is to perform a first action associated with a first battery and the second BMN is to perform a second action associated with a second battery.

21 Claims, 12 Drawing Sheets

(56) References Cited

U.S. PATENT DOCUMENTS

| | | | |
|---|---|---|---|
| 2022/0339978 A1* | 10/2022 | Schroedel | B60C 23/0498 |
| 2023/0083236 A1* | 3/2023 | Kumar | H02P 3/18 |
| | | | 307/10.1 |
| 2023/0139353 A1* | 5/2023 | Monfort | B60L 58/12 |
| | | | 307/10.1 |
| 2025/0055296 A1* | 2/2025 | Yoshikawa | H01M 50/271 |

* cited by examiner

METHODS, APPARATUS, AND ARTICLES OF MANUFACTURE TO IMPROVE ONE-HOP EXTENSION IN WIRELESS BATTERY MANAGEMENT SYSTEMS

TECHNICAL FIELD

This description relates generally to vehicle battery systems and, more particularly, to methods, apparatus, and articles of manufacture to improve one-hop extension in wireless battery management systems.

BACKGROUND

Hybrid electric vehicles (HEVs) and electric vehicles (EVs) are powered by battery systems that include batteries such as lithium-ion batteries. Battery systems may also include a battery management system to monitor the health of the batteries and report the health to a main electronic control unit (ECU) of the HEVs or EVs. The health of the batteries may be impacted by a wide range of conditions.

SUMMARY

For methods, apparatus, and articles of manufacture to improve one-hop extension in wireless battery management systems, an example apparatus includes at least one memory, machine readable instructions, and processor circuitry. The example processor circuitry is to at least one of instantiate or execute the machine readable instructions to cause transmission of an instruction to a first battery monitoring node (BMN) of a vehicle, the first BMN in communication with the apparatus. The example instruction is to cause the first BMN to operate as a repeater for a second BMN of the vehicle, the second BMN noncommunicative with the apparatus. The example processor circuitry is to at least one of instantiate or execute the machine readable instructions to process an acknowledgement from the first BMN, the acknowledgement indicating that the first BMN has configured to operate as the repeater. Additionally, the example processor circuitry is to at least one of instantiate or execute the machine readable instructions to cause transmission of a communication to at least the first BMN, the communication indicating a time at which at least the first BMN is to perform a first action associated with a first battery of the vehicle and the second BMN is to perform a second action associated with a second battery of the vehicle.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
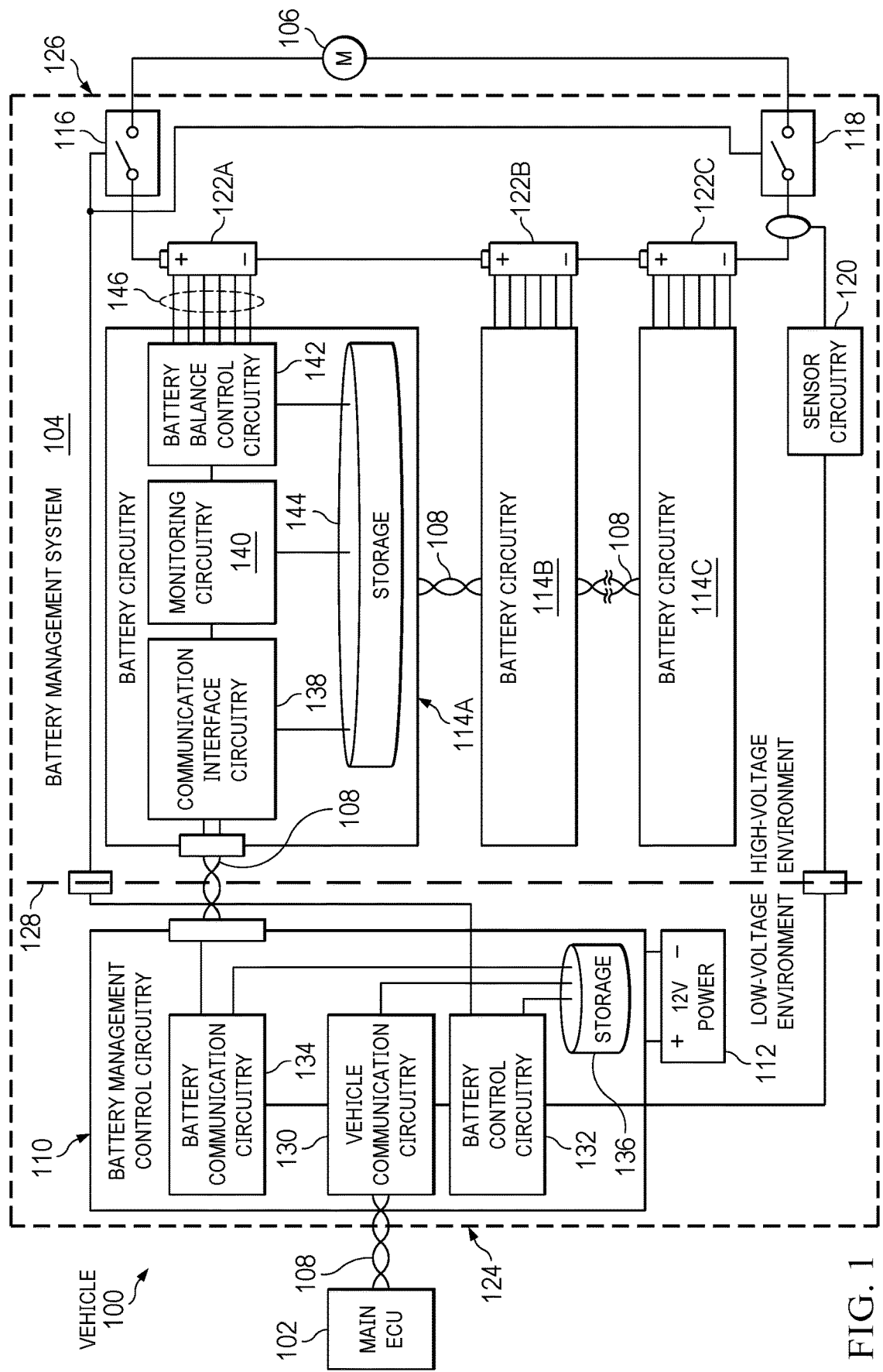
FIG. 1 is a schematic diagram of an example vehicle including an example electronic control unit, an example wired battery management system, and an example motor.

As used herein, connection references (e.g., attached, coupled, adapted to be coupled, connected, joined, among others) are to be construed in light of the specification and, when pertinent, the surrounding claim language. Construction of connection references in the present application shall be consistent with the claim language and the context of the specific which describes the purpose for which various elements are connected. As such, connection references do not necessarily infer that two elements are directly connected and in fixed relation to each other.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" modifies its subjects/values to recognize the potential presence of variations that occur in real world applications. For example, "approximately" may modify dimensions that may not be exact due to manufacturing tolerances and/or other real world imperfections as will be understood by persons of ordinary skill in the art. For example, "approximately" may indicate such dimensions may be within a tolerance range of +/−10% unless otherwise specified in the below description.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

Some battery systems utilized in vehicles include one or more batteries, which may be implemented as one or more battery cells, one or more battery modules, or one or more battery units. Vehicles including such batteries include electric vehicles (EVs) (e.g., land vehicles or automobiles including an electric motor), hybrid electric vehicles (HEVs) (e.g., land vehicles or automobiles including a combustion engine and an electric motor), etc. The batteries of a battery system are monitored and/or controlled by a battery management system that includes main battery management control circuitry and one or more battery monitors. Each battery of a battery system may be coupled to a battery monitor for reporting the status of the battery and/or of other batteries to the main battery management control circuitry. Measurements of status of a battery include a current measurement, a voltage measurement, a temperature reading, etc. The main battery management control circuitry may subsequently report the health or status of the batteries to a main electronic control unit (ECU) of a vehicle.

Additionally, one or more battery monitors may be used to maintain the health of batteries by facilitating a change in the battery performance by decreasing a temperature of one or more batteries. Thus, battery monitors may report battery conditions and performance parameters to main battery management control circuitry. In such examples, in response to detecting a change in performance or health in one or more batteries, main battery management control circuitry may generate a balancing command (e.g., a battery balancing command, a cell balancing command, etc.) or a maintenance command to one or more of the batteries and/or associated battery monitor(s) to re-balance charge levels of the batteries.

Some battery management systems utilize wired connection techniques to couple main battery management control circuitry to battery monitors. For example, some battery management systems utilize isolated coupling circuitry, twisted pair cabling (e.g., utilizing a controller area network (CAN) interface), or a proprietary wired protocol. FIG. 1 is a schematic diagram of an example vehicle 100 including an example electronic control unit (ECU) 102, an example wired battery management system 104, and an example motor 106.

In the illustrated example of FIG. 1, the vehicle 100 is an EV. Alternatively, the vehicle 100 may be an HEV. In this example, the ECU 102 is a main ECU that is implemented by processor circuitry in one or more integrated circuit (IC) packages. For example, the ECU 102 may be a main ECU communicatively coupled to one or more other ECUs, vehicle sensors, vehicle actuators, etc., and/or a combination thereof, by an example bus 108.

In the illustrated example of FIG. 1, the bus 108 is implemented using a wired connection (e.g., a twisted pair of wires). For example, the bus 108 may be implemented by a communication and/or electrical bus based on an automotive or industrial protocol such as CAN protocol, J1939 protocol, Serial Peripheral Interface (SPI) protocol, etc. Alternatively, the bus 108 may be implemented by any other type of wired communication and/or electrical bus. In the example of FIG. 1, the motor 106 is an electric motor. Alternatively, the motor 106 may be any other type of motor.

In the illustrated example of FIG. 1, the wired battery management system 104 includes example battery management control circuitry 110, an example low voltage power source 112, example battery circuitry 114A-C, example first relay circuitry 116, example second relay circuitry 118, and example sensor circuitry 120. In the example of FIG. 1, the battery circuitry 114A-C is coupled to corresponding example batteries 122A-C. In this example, the batteries 122A-C are lithium-ion batteries. For example, one or more of the batteries 122A-C may be a lithium-ion battery including a plurality of cells (e.g., 12 cells, 24 cells, etc.). Alternatively, the batteries 122A-C may be any other type of battery (e.g., a rechargeable battery) such as a nickel-metal hydride battery and/or energy storage device (e.g., an ultracapacitor).

In the illustrated example of FIG. 1, the wired battery management system 104 includes an example low-voltage environment 124 and an example high-voltage environment 126 that meet at an example voltage boundary 128. In this example, the low-voltage environment 124 is configured to operate at 12 V direct current (DC) (e.g., the low voltage power source 112 is a 12 V DC battery). Alternatively, the low-voltage environment 124 may be configured to operate at any other voltage. In some examples, the high-voltage environment 126 may be configured to operate at hundreds of volts DC (e.g., 100 V DC, 200 V DC, 400 V DC, 800 V DC, etc.). The low-voltage environment 124 may be isolated from the high-voltage environment 126 by the use of one or more choke capacitors.

In the illustrated example of FIG. 1, the battery management control circuitry 110 includes example vehicle communication circuitry 130, example battery control circuitry 132, example battery communication circuitry 134, and example first storage 136. In this example, input(s) and/or output(s) of the vehicle communication circuitry 130 is/are coupled to respective output(s) and/or input(s) of the ECU 102 by the bus 108. Input(s) and/or output(s) of the vehicle communication circuitry 130 is/are coupled to respective output(s) and/or input(s) of the battery control circuitry 132. Input(s) and/or output(s) of the battery control circuitry 132 is/are coupled to respective output(s) and/or input(s) of the battery communication circuitry 134. Input(s) and/or output(s) of the battery communication circuitry 134 is/are coupled to respective output(s) and/or input(s) of the battery circuitry 114A-C by the bus 108. In this example, the vehicle communication circuitry 130, the battery control circuitry 132, and the battery communication circuitry 134 are coupled to the first storage 136.

In the illustrated example of FIG. 1, the vehicle communication circuitry 130 interfaces with the ECU 102 and/or, more generally, the vehicle 100 (e.g., one or more other ECUs than the ECU 102, a vehicle actuator, a vehicle infotainment system, etc.). For example, the vehicle communication circuitry 130 may deliver and/or otherwise transmit data, measurements, etc., associated with the battery circuitry 114A-C, the sensor circuitry 120, and/or the batteries 122A-C to the ECU 102. In some examples, the vehicle communication circuitry 130 may receive commands, instructions, etc., from the ECU 102 to control operation of at least one of the battery circuitry 114A-C, the first relay circuitry 116, the second relay circuitry 118, and/or the motor 106.

In the illustrated example of FIG. 1, the battery control circuitry 132 monitors and/or controls operation of the battery circuitry 114A-C. For example, the battery control circuitry 132 may instruct, via the bus 108, the battery communication circuitry 134 to transmit a command, an instruction, etc., to the battery circuitry 114A-C. In some such examples, the command, the instruction, etc., may include a request for measurements associated with the batteries 122A-C, which may include a current, a voltage, and/or a temperature of the batteries 122A-C. In some examples, the command, the instructions, etc., may include a balance command to re-balance charge levels of the batteries 122A-C.

In some examples, the battery control circuitry 132 controls the first relay circuitry 116 and/or the second relay circuitry 118. For example, the battery control circuitry 132 turns on and/or otherwise enables the first relay circuitry 116 and/or the second relay circuitry 118 to deliver power from the batteries 122A-C to the motor 106. In some examples, the battery control circuitry 132 turns off and/or otherwise disables the first relay circuitry 116 and/or the second relay circuitry 118 to remove power from the motor 106. In this example, the first relay circuitry 116 and/or the second relay circuitry 118 are implemented by one or more relays, switches, etc., and/or a combination thereof.

In some examples, the battery control circuitry 132 obtains sensor measurements associated with the batteries 122A-C from the sensor circuitry 120. For example, the sensor circuitry 120 may measure a current and/or a voltage associated with the batteries 122A-C, the motor 106, the first relay circuitry 116, and/or the second relay circuitry 118. In this example, the sensor circuitry 120 may be implemented with one or more sensors such as current sensors, voltage sensors, etc., and/or a combination thereof.

In the illustrated example of FIG. 1, the battery communication circuitry 134 transmits and/or receives data. In some examples, the battery communication circuitry 134 transmits data, which may include requests for measurements and/or commands (e.g., balance or re-balance commands), to the battery circuitry 114A-C via the bus 108. In some examples, the battery communication circuitry 134 receives data, which may include the measurements associated with the batteries 122A-C, from the battery circuitry 114A-C via the bus 108. In some examples, the battery communication circuitry 134 may store the received data in the first storage 136. In the example of FIG. 1, the first storage 136 stores data. For example, the first storage 136 may store data received by the vehicle communication circuitry 130 and/or the battery communication circuitry 134. In some examples, the first storage 136 may receive data obtained by the battery control circuitry 132 from the sensor circuitry 120.

In the illustrated example of FIG. 1, the battery circuitry 114A-C of the illustrated example includes example first battery circuitry 114A, example second battery circuitry 114B, and example third battery circuitry 114C. Alternatively, there may be fewer or more instances of the battery circuitry 114A-C than depicted in FIG. 1. In the example of FIG. 1, the first battery circuitry 114A includes example communication interface circuitry 138, example monitoring circuitry 140, example battery balance control circuitry 142, and example second storage 144. The battery circuitry 114B-C include similar communication interface circuitry, monitoring circuitry, battery balance control circuitry, and storage.

In the illustrated example of FIG. 1, output(s) and/or input(s) of the communication interface circuitry 138 is/are coupled to respective input(s) and/or output(s) of the battery communication circuitry 134 via the bus 108. Output(s) and/or input(s) of the communication interface circuitry 138 is/are coupled to respective input(s) and/or output(s) of the monitoring circuitry 140. Output(s) and/or input(s) of the monitoring circuitry 140 is/are coupled to respective input(s) and/or output(s) of the battery balance control circuitry 142. Output(s) and/or input(s) of the battery balance control circuitry 142 is/are coupled to respective input(s) and/or output(s) of the batteries 122A-C by example battery balance circuitry 146. In some examples, the battery circuitry 114A-C includes the battery balance circuitry 146. In this example, the communication interface circuitry 138, the monitoring circuitry 140, and the battery balance control circuitry 142 are coupled to the second storage 144.

In the illustrated example of FIG. 1, each of the battery circuitry 114A-C includes the communication interface circuitry 138 to receive and/or transmit data. In some examples, the communication interface circuitry 138 may receive data, such as a request for data or a command, from the battery communication circuitry 134 via the bus 108. In some examples, the communication interface circuitry 138 may transmit data, such as measurement data associated with the batteries 122A-C or an acknowledgment of a receipt or completion of the command to the battery communication circuitry 134 via the bus 108.

In the illustrated example of FIG. 1, the monitoring circuitry 140 monitors and/or otherwise controls operation of the batteries 122A-C. In some examples, the monitoring circuitry 140 measures a condition, a parameter, etc., associated with the batteries 122A-C, which may include a current, a voltage, a temperature, etc. In some such examples, the monitoring circuitry 140 measures the condition, the parameter, etc., by obtaining the measurement from the battery balance control circuitry 142. In some examples, the monitoring circuitry 140 determines a state of charge and/or a depth of charge of one(s) of the batteries 122A-C based on an amperage measurement, a voltage measurement, etc., measured by the monitoring circuitry 140, the battery balance control circuitry 142, and/or the battery balance circuitry 146. As used herein, the term "state of charge" may refer to a level of charge of a battery relative to its capacity. In some examples, a state of charge may have a unit of measure of percentage points (e.g., 0%=empty, 100%=full, etc.). As used herein, the term "depth of charge" may refer to an inverse of a level of charge of a battery relative to its capacity. In some examples, a depth of charge may have a unit of measure of percentage points (e.g., 100%=empty, 0%=full, etc.).

In the illustrated example of FIG. 1, the battery balance control circuitry 142 monitors and/or controls balancing operations (e.g., battery balance operations) associated with the batteries 122A-C. In some examples, the battery balance control circuitry 142 obtains measurements associated with the batteries 122A-C, which may include a current (e.g., an amperage measurement), a voltage (e.g., a voltage measurement), a temperature (e.g., a temperature measurement), etc., associated with one(s) of the batteries 122A-C. In some such examples, the battery balance circuitry 146 includes one or more current, voltage, and/or temperature sensors or associated sensor circuitry.

In some examples, the battery balance control circuitry 142 controls the battery balance circuitry 146 to execute a balance operation by rebalancing charge levels of one or more of the batteries 122A-C. For example, the battery balance circuitry 146 may be implemented by passive battery balancing circuitry, which may drain charge from one or more of the batteries 122A-C that have excess charge relative to the other one or more of the batteries 122A-C. In some such examples, the passive battery balancing circuitry may be implemented with a resistor coupled in parallel with each of the batteries 122A-C, which may implement a fixed shunt resistor circuit that can be used to drain charge from the respective one or more of the batteries 122A-C. The battery balance circuitry 146 may include a switch (e.g., a transistor) coupled between each resistor and battery pair. In some examples, the battery balance control circuitry 142 controls the switch by turning on or off the switch to effectuate a battery balancing operation on one or more of the batteries 122A-C. Alternatively, the passive battery balancing circuitry may be implemented with a Zener diode and a resistor coupled in parallel with each of the batteries 122A-C, which may be used to drain charge from the respective one or more of the batteries 122A-C and turn off battery balancing when a battery voltage drops below a threshold.

In some examples, the battery balance circuitry 146 is implemented by active battery balancing circuitry, which may drain charge from one or more of the batteries 122A-C that have excess charge relative to the other one or more of the batteries 122A-C. In some such examples, the active battery balancing circuitry may be implemented with a switch (e.g., a transistor, a single-pole-double-throw switch, etc.) and a capacitor coupled in parallel with each of the batteries 122A-C, that can be used to provide charge from a first one or more of the batteries 122A-C that have a higher charge with respect to an average, median, etc., level of charge of the batteries 122A-C to a second one or more of the batteries 122A-C that have a lower charge with respect to the average, the median, etc. In some such examples, the battery balance control circuitry 142 may control the switch by turning on or off the switch to execute a battery balancing operation on one or more of the batteries 122A-C. Alternatively, the active battery balancing circuitry may be implemented with a switch in parallel with each of the batteries 122A-C and a switched transformer, which may be used to transfer charge from a first ones or more of the batteries 122A-C that have a higher level of charge to a second one or more of the batteries 122A-C that have a lower level of charge.

In the illustrated example of FIG. 1, the second storage 144 stores data. For example, the second storage 144 may store data received by the communication interface circuitry 138 and/or the monitoring circuitry 140. In some examples, the second storage 144 may receive data obtained and/or otherwise measured by the battery balance control circuitry 142 by the battery balance circuitry 146.

As described above, wired connection techniques, such as those described in connection with FIG. 1, may require the use of choke capacitors for isolation and protection between high and low voltage areas in a battery management system which can complicate manufacture and development of such systems. Additionally, costs (e.g., bill of materials cost, battery system repair costs, etc.), weight, and complexity of repair and replacement of vehicles including battery systems utilizing wired connection techniques are increased. To overcome the complications of wired connection techniques, some battery systems have implemented wireless battery management systems. For example, example wireless battery management systems reduce battery system cost, and/or, more generally, vehicle cost, battery repair and replacement complexity, and vehicle weight (which may increase a fuel efficiency of the vehicle). For example, if one or more batteries of a vehicle implementing wired connection techniques are damaged, all of the batteries may need to be replaced due to the nature of the wired connection technique. Conversely, if the vehicle were implementing an example wireless battery management system as disclosed herein, repairs could be limited to only those batteries that were damaged.

Example wireless battery management systems disclosed herein include wireless battery management control circuitry that is communicatively coupled by wireless connection(s) to battery monitoring nodes, which may be implemented by battery circuitry including and/or coupled to a battery. Being implemented in vehicles, wireless battery management systems may be subjected to one or more safety standards. For example, the Automotive Safety Integrity Level (ASIL) is a risk classification scheme defined by the International Organization for Standardization (ISO) 26262 standard. The ASIL scheme specifies functional safety for road vehicles and as such, systems on a chip (SoCs) and/or other integrated circuits implemented in vehicles may be evaluated based on the ASIL scheme. The ASIL scheme includes four levels: ASIL-A, ASIL-B, ASIL-C, and ASIL-D. The ASIL-D level specifies the highest level of safety measures in the ISO 26262 standard to avoid unreasonable residual risk.

To comply with the ASIL-D level of the ISO 26262 standard, a battery management system can use separate measurement chains for temperature, voltage and/or other events or have built-in tests to ensure that the probability of a failure meets the requirements of the ISO 26262 standard. Additionally, the ASIL-D level of the ISO 26262 standard requires that data be transferred from battery monitoring nodes to battery management control circuitry within a time interval specified by the ISO 26262 standard (e.g., to ensure the safety of road vehicles). The time interval is typically less than 100 milliseconds (ms).

One issue that presents in wireless battery management systems is that communication between one or more battery monitoring nodes and wireless battery management control circuitry may be interrupted. For example, communication between a battery monitoring node and wireless battery management control circuitry may be interrupted due to radio frequency (RF) circuitry of the battery monitoring node being damaged, an antenna of the RF circuitry being misconfigured, the presence of an obstruction and/or interference (e.g., physical and/or electromagnetic) that occurred after the wireless battery management system was installed, and/or degradation (e.g., corrosion) of the RF circuitry and/or, more generally, the battery monitoring node that occurs over a period of time. To address issues resulting from such communication interruptions, some wireless battery management systems utilize a one-hop technique.

For example, under a one-hop technique, in a wireless battery management system where one or more battery monitoring nodes have interrupted communication with wireless battery management control circuitry, one or more intermediary battery monitoring nodes operate as a repeater (e.g., repeater circuitry) to link the one or more battery monitoring nodes having interrupted communication and the wireless battery management control circuitry. In this manner, the one or more battery monitoring nodes having interrupted communication can communicate battery monitoring data back to the wireless battery management control circuitry. Additionally, the wireless battery management control circuitry can communicate data to the one or more battery monitoring nodes having interrupted communication. However, some one-hop techniques can lead to synchronization issues in communications (e.g., communications reporting measurements) which can lead to wireless battery management control circuitry making incorrect estimations that result in incorrect commands being issued to battery monitoring nodes.

Figure 2:
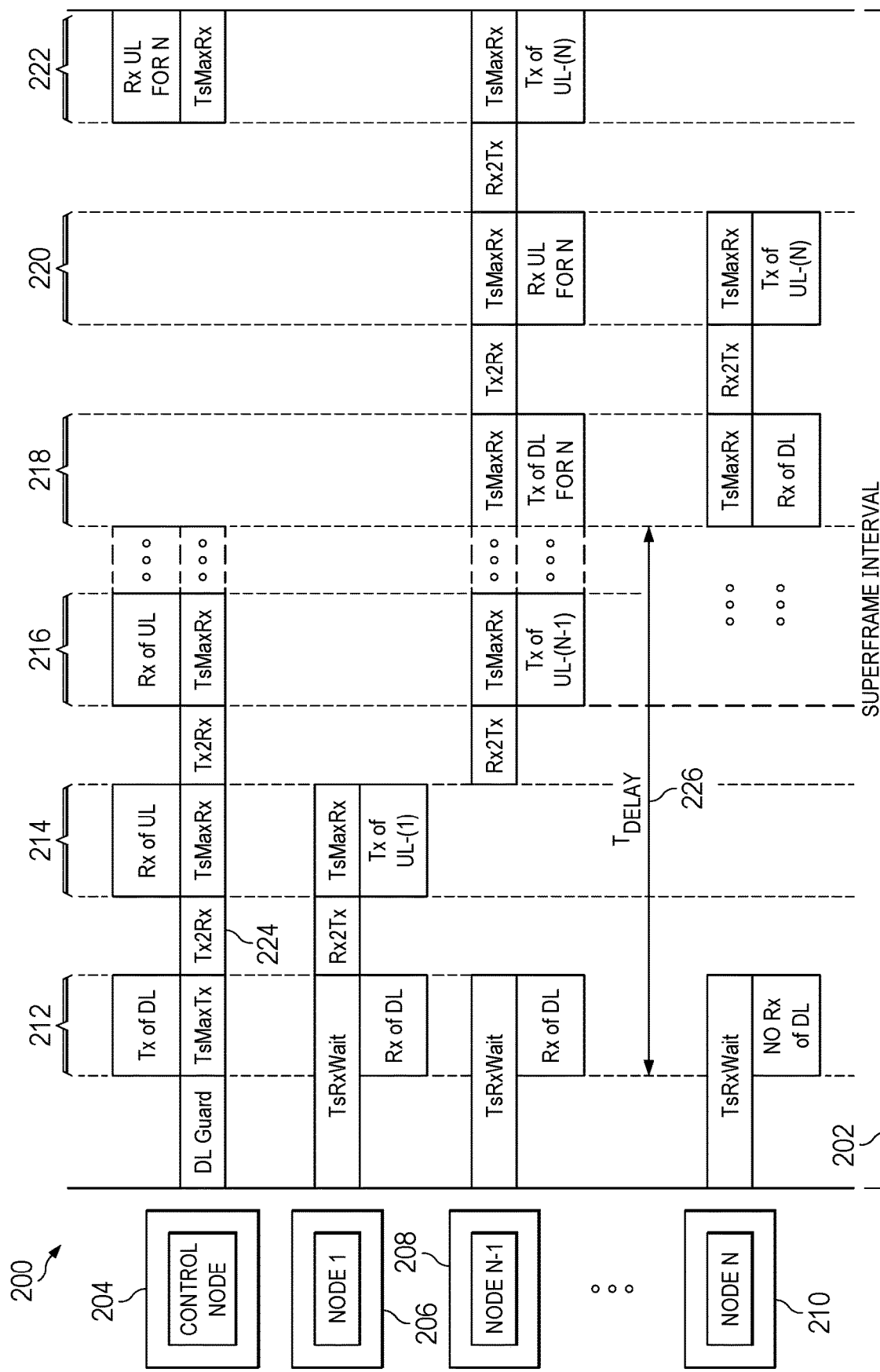
FIG. 2 depicts an example timing diagram of an example superframe interval according to one-hop techniques that can lead to synchronization issues in communicating with battery monitoring nodes of batteries.

For example, FIG. 2 depicts an example timing diagram 200 of an example superframe interval 202 according to such one-hop techniques. As used herein, the term "superframe" refers to a data frame based on a Transmission System 1 (T1) framing standard (also referred to as D4 framing). The timing diagram 200 illustrates communication operations associated with an example control node 204, an example first battery monitoring node (NODE 1) 206, an example second battery monitoring node (NODE N−1) 208, and an example third battery monitoring node (NODE N) 210 implementing such one-hop techniques that can lead to synchronization issues. For example, the control node 204 may be implemented by wireless battery management control circuitry. In some examples, the first battery monitoring node 206 may be implemented by first battery circuitry. In some examples, the second battery monitoring node 208 may be implemented by second battery circuitry. In some examples, the third battery monitoring node 210 may be implemented by third battery circuitry.

In the illustrated example of FIG. 2, the superframe interval 202 corresponds to an interval of operation of a wireless battery management system including the control node 204, the first battery monitoring node 206, the second battery monitoring node 208, and the third battery monitoring node 210. In the example of FIG. 2, the control node 204 subdivides the superframe interval 202 into one or more uplink frames and/or one or more downlink frames. For example, the superframe interval 202 includes an example first downlink frame 212, an example first uplink frame 214, an example second uplink frame 216, an example second downlink frame 218, an example third uplink frame 220, and an example fourth uplink frame 222. In subdividing the superframe interval 202, the control node 204 includes a transmission interval after each uplink frame and each downlink frame to allow for circuitry to switch between uplink and downlink modes of operation.

In example operation, during the first downlink frame 212, the control node 204 transmits a downlink (DL) communication to the first battery monitoring node 206, the second battery monitoring node 208, and the third battery monitoring node 210. For example, the DL communication includes an instruction to monitor batteries associated with the first battery monitoring node 206, the second battery monitoring node 208, and the third battery monitoring node 210. In the first downlink frame 212, transmission of the DL communication by the control node 204 is represented by a transmit frame (TsMaxTx). In the first downlink frame 212, reception of the DL communication by the battery monitoring nodes is represented by a receive frame (TsRxWait). Notably, during the first downlink frame 212, the third battery monitoring node 210 does not receive the DL communication (NO Rx of DL). As described above, the control node 204 includes an example switch frame 224 between the first downlink frame 212 and the first uplink frame 214. For example, during the switch frame 224, the control node 204 switches from a transmit mode of operation to a receive mode of operation (Tx2Rx) and the first battery monitoring node 206 switches from a receive mode of operation to a transmit mode of operation (Rx2Tx).

In example operation, during the first uplink frame 214, the control node 204 receives an uplink (UL) communication from the first battery monitoring node 206. For example, the UL communication includes results of the first battery monitoring node 206 executing the instruction received from the control node 204 during the first downlink frame 212. In the first uplink frame 214, transmission of the UL communication by the first battery monitoring node 206 is represented by a transmit frame (TsMaxRx). In the first uplink frame 214, reception of the UL communication by the control node 204 is represented by a receive frame (TsMaxRx). During the second uplink frame 216, the control node 204 receives an UL communication from the second battery monitoring node 208.

As described above, during the first downlink frame 212, the third battery monitoring node (NODE N) 210 did not receive the DL communication. For example, communication between the third battery monitoring node (NODE N) 210 and the control node 204 has been interrupted. As such, the second battery monitoring node (NODE N−1) 208 operates as a repeater to facilitate communication between the control node 204 and the third battery monitoring node 210. For example, after the second battery monitoring node (NODE N−1) 208 completes transmission of a UL communication during the second uplink frame 216, the second battery monitoring node (NODE N−1) 208 repeats the DL communication to the third battery monitoring node (NODE N) 210 during the second downlink frame 218.

In the illustrated example of FIG. 2, after the third battery monitoring node (NODE N) 210 processes the DL communication, the third battery monitoring node (NODE N) 210 transmits a UL communication to the second battery monitoring node (NODE N−1) 208 during the third uplink frame 220. After the second battery monitoring node (NODE N−1) 208 completes receipt of the UL communication from the third battery monitoring node (NODE N) 210, the second battery monitoring node (NODE N−1) 208 repeats the UL communication to the control node 204 during the fourth uplink frame 222.

However, as illustrated in FIG. 2, by waiting for the second battery monitoring node (NODE N-1) 208 to transmit a UL communication to the control node 204 before repeating the DL communication to the third battery monitoring node (NODE N) 210, the one-hop technique of FIG. 2 creates a substantial delay ($T_{DELAY}$) 226 between the time when DL communications are received by the third battery monitoring node (NODE N) 210 and other battery monitoring nodes in the wireless battery management system. As such, there is also a delay between any actions (e.g., measurements) taken in response to the DL communications by the third battery monitoring node (NODE N) 210 and other battery monitoring nodes in the wireless battery management system. The delay 226 and corresponding delay between action (e.g., measurement) time is problematic in battery management systems because proper management of batteries may require that actions associated with (e.g., measurements of) all the batteries be performed at approximately the same time. Furthermore, the delay 226 may prevent compliance of such battery management systems with applicable standards. For example, proper management of batteries may require that actions be performed within 10 s of microseconds of each other. However, the delay 226 and corresponding delay between action time that results from the one-hop technique of FIG. 2 can be on the order of 10 s of milliseconds.

Example methods, apparatus, and articles of manufacture disclosed herein improve one-hop extension in wireless battery management systems. For example, disclosed examples include an optimal scheduling for one-hop extension that preserves synchronization of data (e.g., current, voltage, and/or temperature measurements) in the wireless battery management system. In some disclosed examples, wireless battery management control circuitry is communicatively coupled by wireless connection(s) to battery monitoring nodes, which may be implemented by battery circuitry including and/or coupled to a battery. To address the synchronization issues associated with and thereby improve one-hop techniques, examples disclosed herein instruct repeater battery circuitry (e.g., one or more battery monitoring nodes) to forward a DL communication to noncommunicative battery circuitry before the repeater battery circuitry processes the DL communication. Additionally, the example DL communication specifies a time at which noncommunicative battery circuitry is to process the DL communication (e.g., perform an action associated with a corresponding battery such as making a measurement of a corresponding battery). The specified time may be based on the time at which transmission of the DL communication to the noncommunicative battery circuitry is expected to be completed.

In this manner, examples disclosed herein preserve synchronization between battery circuitry instead of waiting for battery circuitry to process a DL communication (e.g., make a measurement) before instructing noncommunicative battery circuitry. In some examples disclosed herein, after the noncommunicative battery circuitry processes the DL communication and sends a corresponding UL communication to the repeater battery circuitry, the repeater battery circuitry transmits the UL communication from the noncommunicative battery circuitry to the wireless battery management control circuitry. For example, the superframe interval may have consecutive uplink frames where during one uplink frame the repeater battery circuitry is to transmit a UL communication for the repeater battery circuitry and during the other uplink frame, the repeater battery circuitry is to transmit the UL communication from the noncommunicative battery circuitry. Additionally or alternatively, the repeater battery circuitry aggregate the UL communication of the repeater battery circuitry and the UL communication from the noncommunicative battery circuitry and sends the information to the wireless battery management control circuitry in one uplink frame.

Figure 3:
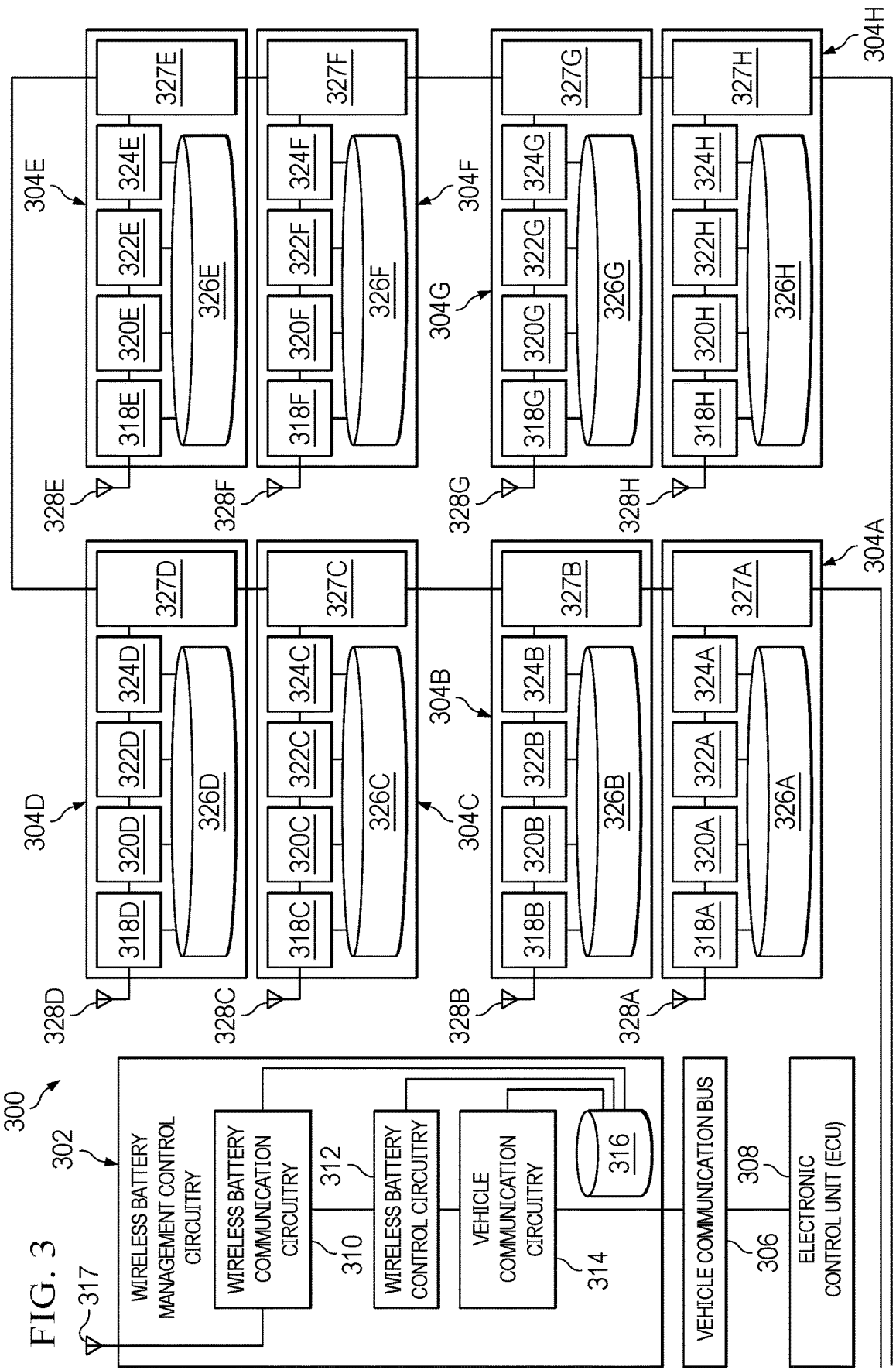
FIG. 3 is a schematic diagram of an example wireless battery system including example wireless battery management control circuitry, example battery circuitry, an example vehicle communication bus, and an example electronic control unit (ECU).

FIG. 3 is a schematic diagram of an example wireless battery system 300 including example wireless battery management control circuitry 302, example battery circuitry 304A-H, an example vehicle communication bus 306, and an example electronic control unit (ECU) 308. In some examples, the vehicle communication bus 306 may be implemented by the bus 108 of FIG. 1. In some examples, the ECU 308 of FIG. 3 may be implemented by the ECU 102 of FIG. 1. In some examples, the wireless battery management control circuitry 302 may be referred to as WBMC circuitry.

In the illustrated example of FIG. 3, the wireless battery management control circuitry 302 monitors and/or controls the battery circuitry 304A-H and/or, more generally, communicates with the battery circuitry 304A-H, via wireless connection(s). The wireless battery management control circuitry 302 of the illustrated example includes example wireless battery communication circuitry 310, example wireless battery control circuitry 312, example vehicle communication circuitry 314, and an example first storage 316.

In the illustrated example of FIG. 3, the wireless battery communication circuitry 310 is coupled to an example transceiver 317. For example, the transceiver 317 may receive and/or transmit data using wireless communication techniques. In the example of FIG. 3, the transceiver 317 includes an antenna and RF circuitry that is configured to at least one of receive or transmit RF signals. In additional or alternative examples, the transceiver 317 may implement wireless communication such as wireless fidelity (Wi-Fi) communication, Wi-Fi Direct communication, Bluetooth communication, near field communication (NFC), etc., and/or a combination thereof. In the example of FIG. 3, the transceiver 317 communicates according to the universal asynchronous receiver transmitter (UART) protocol. In additional or alternative examples, the transceiver 317 communicates according to another protocol such as the SPI protocol, the CAN protocol, the J1939 protocol, the Inter-Integrated Circuit (I2C) protocol, etc. In some examples, the wireless battery management control circuitry 302 may include the transceiver 317.

In the illustrated example of FIG. 3, the wireless battery control circuitry 312 of the wireless battery management control circuitry 302 monitors and/or controls operation of the battery circuitry 304A-H. For example, the wireless battery control circuitry 312 instructs the wireless battery communication circuitry 310 to transmit data frames (e.g., uplink frames, downlink frames, etc.) to one or more of the battery circuitry 304A-H. In some such examples, the data frames include a request for data, measurements, etc., associated with the batteries 327A-H. For example, data frames from the wireless battery control circuitry 312 may instruct analog devices (e.g., analog sensors) of the battery circuitry 304A-H to take measurements of amperage, voltage, and/or temperature associated with the batteries 327A-H.

In additional or alternative examples, the data frames include a command, a direction, an instruction, etc., to implement a battery balance or maintenance operation. For example, data frames from the wireless battery control circuitry 312 may instruct the battery circuitry 304A-H to balance charge levels of one or more of the batteries 327A-H, perform load balancing, perform cooling, open relays to the motor 106, among others. In some examples, a data frame includes an instruction complete a device safety diagnostic test (e.g., a self-diagnostic test) or the result of such a test. In additional or alternative examples, a data frame includes an instruction complete a wireless diagnostic test (e.g., a self-diagnostic test, an operations test, etc.) or the result of such a test. In some examples, a data frame includes configuration information for the battery circuitry 304A-H. For example, the configuration information may be a configuration instruction and/or reconfiguration instruction. In additional or alternative examples, a data frame includes a request for an identifier (ID) of one or more of the battery circuitry 304A-H and/or a response providing such an ID. In some examples, the wireless battery control circuitry 312 improves one-hop extension in wireless battery management systems by causing battery circuitry operating as a repeater to transmit a downlink communication to noncommunicative battery circuitry before the repeater processes the downlink communication. In some examples, a wireless battery management system may be referred to as a WBMS.

In the illustrated example of FIG. 3, input(s) and/or output(s) of the vehicle communication circuitry 314 is/are coupled to respective output(s) and/or input(s) the ECU 308 by the vehicle communication bus 306. Input(s) and/or output(s) of the vehicle communication circuitry 314 is/are coupled to respective output(s) and/or input(s) of the wireless battery control circuitry 312. Input(s) and/or output(s) of the wireless battery control circuitry 312 is/are coupled to respective output(s) and/or input(s) of the wireless battery communication circuitry 310. Input(s) and/or output(s) of the wireless battery communication circuitry 310 is/are coupled to the transceiver 317. In this example, the vehicle communication circuitry 314, the wireless battery control circuitry 312, and the wireless battery communication circuitry 310 are coupled to the first storage 316.

In the illustrated example of FIG. 3, the battery circuitry 304A-H include respective example communication interface circuitry 318A-H, respective example monitoring circuitry 320A-H, respective example battery balance control circuitry 322A-H, respective example battery balance circuitry 324A-H, and a respective example second storage 326A-H. In some examples, the battery circuitry 304A-H include respective batteries 327A-H. In additional or alternative examples, the battery circuitry 304A-H is coupled to the respective batteries 327A-H. In some examples, each instance of the battery circuitry 304A-H includes more than one of the batteries 327A-H.

In the illustrated example of FIG. 3, the batteries 327A-H are lithium-ion batteries. For example, one or more of the batteries 327A-H is a lithium-ion battery including a plurality of cells (e.g., 12 cells, 24 cells, etc.). Alternatively, the batteries 327A-H may be any other type of battery (e.g., a rechargeable battery) such as a nickel-metal hydride battery and/or energy storage device (e.g., an ultracapacitor). In this example, the batteries 327A-H are coupled in a series configuration. For example, a first battery 327A of the batteries 327A-H may be coupled to a second battery 327B of the batteries 327A-H in series. Alternatively, the batteries 327A-H may be coupled to each other in any other configuration.

In the illustrated example of FIG. 3, each of the battery circuitry 304A-H is coupled to a respective example transceivers 328A-H. For example, the transceivers 328A-H may receive and/or transmit data using wireless communication techniques. In the example of FIG. 3, each of the transceivers 328A-H includes an antenna and RF circuitry that is configured to at least one of receive or transmit RF signals.

In additional or alternative examples, each of the transceivers 328A-H may implement wireless communication such as Wi-Fi communication, Wi-Fi Direct communication, Bluetooth communication, NFC, etc., and/or a combination thereof. In the example of FIG. 3, the transceivers 328A-H communicate according to the UART protocol. In additional or alternative examples, the transceivers 328A-H communicate according to another protocol such as the SPI protocol, the CAN protocol, the J1939 protocol, the I2C protocol, etc. In some examples, one or more of the battery circuitry 304A-H may include a respective one of the transceivers 328A-H.

In some examples, one or more of the wireless battery communication circuitry 310, the wireless battery control circuitry 312, the vehicle communication circuitry 314, the first storage 316, and/or, more generally, the wireless battery management control circuitry 302, the communication interface circuitry 318A-H, the monitoring circuitry 320A-H, the battery balance control circuitry 322A-H, the battery balance circuitry 324A-H, the second storage 326A-H, and/or, more generally, the battery circuitry 304A-H, may be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) (e.g., field programmable gate array(s) (FPGA(s))). In some examples, the first storage 316 and/or the second storage 326A-H may be implemented with non-volatile memory (e.g., electrically erasable programmable read-only memory (EEPROM), flash memory, etc.) and/or volatile memory (e.g., Synchronous Dynamic Random Access Memory (SDRAM), Dynamic Random Access Memory (DRAM), RAMBUS® Dynamic Random Access Memory (RDRAM®), and/or any other type of random access memory device).

In some examples, each instance of the battery circuitry 304A-H may implement a battery monitoring node. For example, a first battery monitoring node may be implemented by first communication interface circuitry 318A of the communication interface circuitry 318A-H, first monitoring circuitry 320A of the monitoring circuitry 320A-H, first battery balance control circuitry 322A of the battery balance control circuitry 322A-H, first battery balance circuitry 324A of the battery balance circuitry 324A-H, a first storage instance 326A of the second storage 326A-H, and/or a first transceiver 328A of the transceivers 328A-H. In some examples, the first battery monitoring node includes a first battery 327A of the batteries 327A-H. In the example of FIG. 3, there are eight battery monitoring nodes. As described with respect to the first battery monitoring node, each battery monitoring node corresponds to respective instances of the communication interface circuitry 318A-H, respective instances of the monitoring circuitry 320A-H, respective instances of the battery balance control circuitry 322A-H, respective instances of the battery balance circuitry 324A-H, respective instances of the second storage 326A-H, respective instances of the batteries 327A-H, and/or respective instances of the transceivers 328A-H. Alternatively, there may be fewer or more battery nodes than the eight battery monitoring nodes depicted in the example of FIG. 3. In some examples, a battery monitoring node may be referred to as a BMN and one or more battery monitoring nodes may be referred to as BMNs.

In the illustrated example of FIG. 3, input(s) and/or output(s) of the communication interface circuitry 318A-H is/are coupled to respective output(s) and/or input(s) the transceivers 328A-H. Input(s) and/or output(s) of the communication interface circuitry 318A-H is/are coupled to respective output(s) and/or input(s) of the monitoring circuitry 320A-H. Input(s) and/or output(s) of the monitoring circuitry 320A-H is/are coupled to respective output(s) and/or input(s) of the battery balance control circuitry 322A-H. Input(s) and/or output(s) of the battery balance control circuitry 322A-H is/are coupled to respective output(s) and/or input(s) of the battery balance circuitry 324A-H. In the example of FIG. 3, the communication interface circuitry 318A-H, the monitoring circuitry 320A-H, the battery balance control circuitry 322A-H, and the battery balance circuitry 324A-H are coupled to the second storage 326A-H. Additionally, input(s) and/or output(s) of the battery balance circuitry 324A-H is/are coupled to the batteries 327A-H.

In the illustrated example of FIG. 3, the wireless battery management control circuitry 302 includes the vehicle communication circuitry 314 to interface with the ECU 308 and/or, more generally, the vehicle 100 of FIG. 1 (e.g., one or more other ECUs than the ECU 308, a vehicle actuator, a vehicle infotainment system, etc.). For example, the vehicle communication circuitry 314 may deliver and/or otherwise transmit data, measurements, etc., associated with the battery circuitry 304A-H and/or the batteries 327A-H to the ECU 308 via the vehicle communication bus 306. In some such examples, the vehicle communication circuitry 314 may deliver and/or otherwise report battery performance and other battery parameters from one or more of the batteries 327A-H. For example, the vehicle communication circuitry 314 may generate an alert, which may include the battery performance and other battery parameters. In some examples, the vehicle communication circuitry 314 may receive commands, instructions, etc., from the ECU 308 via the vehicle communication bus 306 to control operation of one or more of the battery circuitry 304A-H.

In the illustrated example of FIG. 3, the wireless battery management control circuitry 302 includes the wireless battery communication circuitry 310 to control the transceiver 317 to transmit data to and/or receive data from the battery monitoring nodes. In some examples, the wireless battery communication circuitry 310 may invoke the transceiver 317 to transmit a DL communication, an instruction, etc., to the battery circuitry 304A-H. In some such examples, the command, the instruction, etc., may include a request for measurements associated with the batteries 327A-H, which may include a current, a voltage, and/or a temperature of the batteries 327A-H. In some examples, the command, the instructions, etc., may include a balance command to re-balance charge levels of the batteries 327A-H via the battery balance circuitry 324A-H. In the example of FIG. 3, the first storage 316 stores data. For example, the first storage 316 stores data received and/or generate by the wireless battery communication circuitry 310, the wireless battery control circuitry 312, and/or the vehicle communication circuitry 314. Additionally, as described below, in some examples, the first storage 316 stores data representative of a topology of the wireless battery system 300.

In the illustrated example of FIG. 3, the battery circuitry 304A-H includes the communication interface circuitry 318A-H to receive and/or transmit data. In some examples, the communication interface circuitry 318A-H may be implemented the communication interface circuitry 138 of FIG. 1 or portion(s) thereof. In some examples, the communication interface circuitry 318A-H may receive, via the transceivers 317, 328A-H, data (e.g., a data frame, a downlink communication, etc.), that includes a command or a request for data, from the wireless battery management control circuitry 302. In some examples, the communication interface circuitry 318A-H may transmit, via the transceivers 317, 328A-H, data (e.g., a data frame, an uplink communication, etc.), which may include measurement data associated with the batteries 327A-H or an acknowledgment of a receipt or completion of the command, to the wireless battery management control circuitry 302.

In the illustrated example of FIG. 3, the battery circuitry 304A-H includes the monitoring circuitry 320A-H to monitor and/or otherwise control operation of the batteries 327A-H. In some examples, the monitoring circuitry 320A-H causes measurement of a condition, a parameter, etc., associated with the batteries 327A-H, which may include a current, a voltage, a temperature, etc. In some such examples, the monitoring circuitry 320A-H may cause measurement of the condition, the parameter, etc., by obtaining the measurement from the battery balance control circuitry 322A-H. In some examples, the monitoring circuitry 320A-H determines a state of charge and/or a depth of charge of one(s) of the batteries 327A-H based on an amperage measurement, a voltage measurement, etc., measured by the monitoring circuitry 320A-H, the battery balance control circuitry 322A-H, and/or the battery balance circuitry 324A-H.

In the illustrated example of FIG. 3, the battery circuitry 304A-H includes the battery balance control circuitry 322A-H to monitor and/or control balancing operations associated with the batteries 327A-H. In some examples, the battery balance control circuitry 322A-H obtains measurements associated with the batteries 327A-H, which may include a current (e.g., an amperage measurement), a voltage (e.g., a voltage measurement), a temperature (e.g., a temperature measurement), etc., associated with one(s) of the batteries 327A-H. In some such examples, the battery balance circuitry 324A-H may include one or more current, voltage, and/or temperature sensors or associated sensor circuitry.

In some examples, the battery balance control circuitry 322A-H may control the battery balance circuitry 324A-H to re-balance charge levels of one(s) of the batteries 327A-H. For example, the battery balance circuitry 324A-H may be implemented by passive battery balancing circuitry or an active battery balancing circuitry as described above in connection with FIG. 1. In some such examples, the battery balance circuitry 324A-H may be implemented by passive battery balancing circuitry such as a fixed shunt resistor circuit and/or a Zener diode/fixed shunt resistor circuit. In some examples, the battery balance circuitry 324A-H may be implemented by active battery balancing circuitry such as a switch and capacitor circuit or a switch and switched transformer circuit.

In the illustrated example of FIG. 3, the battery circuitry 304A-H includes the second storage 326A-H to store data. For example, the second storage 326A-H may store data received by the communication interface circuitry 318A-H and/or the monitoring circuitry 320A-H. In some examples, the second storage 326A-H may receive data obtained and/or otherwise measured by the battery balance control circuitry 322A-H and/or by the battery balance circuitry 324A-H.

While an example manner of implementing the wireless battery management control circuitry 302 is illustrated in FIG. 3, one or more of the elements, processes, and/or devices illustrated in FIG. 3 may be combined, divided, re-arranged, omitted, eliminated, and/or implemented in any other way. Further, the example wireless battery communication circuitry 310, the wireless battery control circuitry 312, the vehicle communication circuitry 314, the first storage 316, the transceiver 317, and/or, more generally, the example wireless battery management control circuitry 302 of FIG. 3, may be implemented by hardware alone or by hardware in combination with software and/or firmware. Thus, for example, any of the example wireless battery communication circuitry 310, the wireless battery control circuitry 312, the vehicle communication circuitry 314, the first storage 316, the transceiver 317, and/or, more generally, the example wireless battery management control circuitry 302 of FIG. 3, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example the example wireless battery management control circuitry 302 of FIG. 3 may include one or more elements, processes, and/or devices in addition to, or instead of, those illustrated in FIG. 3, and/or may include more than one of any or all of the illustrated elements, processes, and devices.

Figure 4:
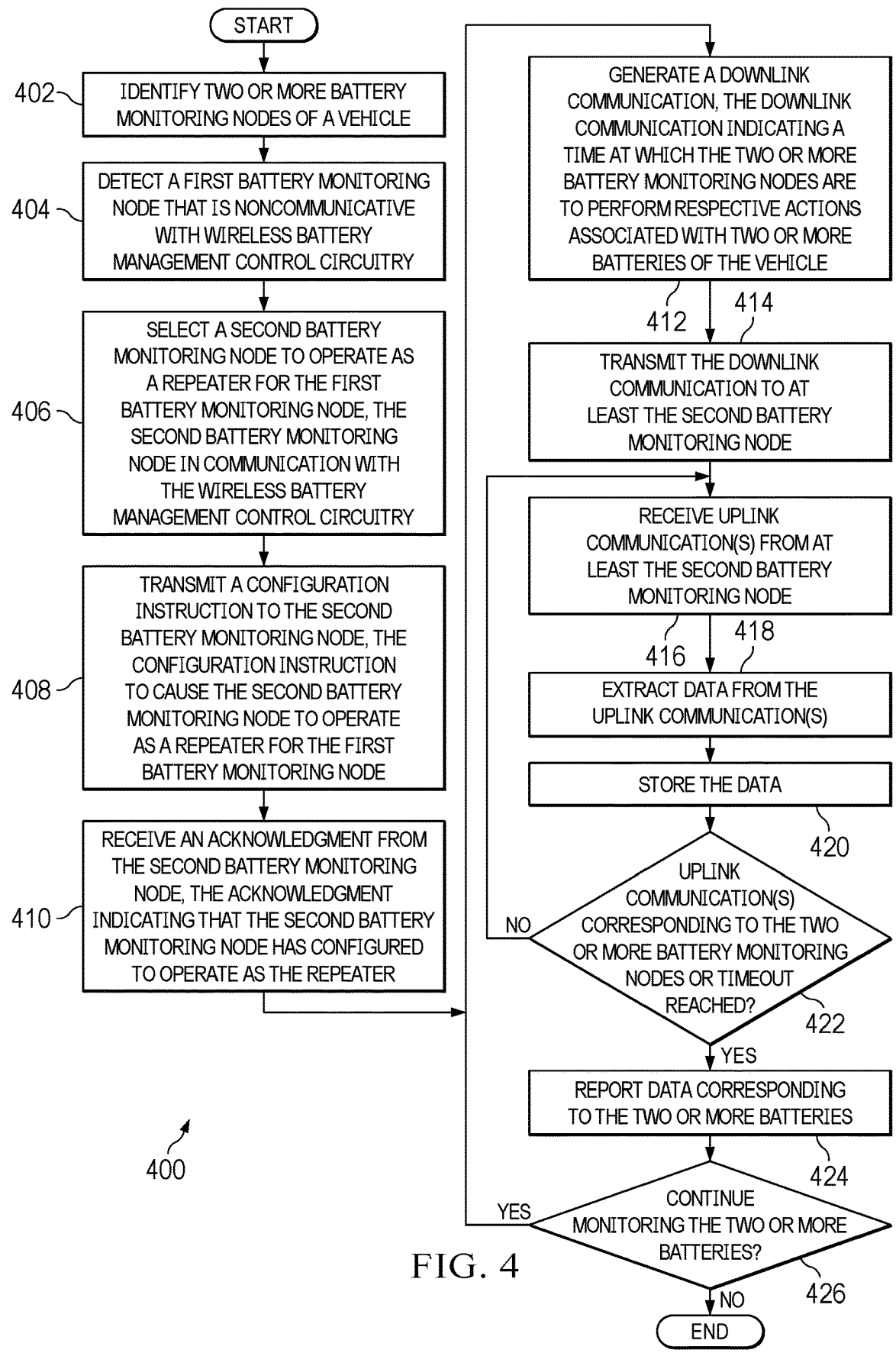
FIG. 4 is a flowchart representative of an example process that may be performed using machine readable instructions that can be executed by processor circuitry and/or hardware circuitry configured to implement the wireless battery management control circuitry of FIG. 3 to operate a wireless battery system to improve one-hop techniques.

A flowchart representative of example machine readable instructions, which may be executed to configure processor circuitry to implement the example wireless battery management control circuitry 302 of FIG. 3, is shown in FIG. 4. The machine readable instructions may be one or more executable programs or portion(s) of an executable program for execution by processor circuitry, such as the processor circuitry 812 shown in the example processor platform 800 discussed below in connection with FIG. 8 and/or the example processor circuitry discussed below in connection with FIGS. 10 and/or 11. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowchart illustrated in FIG. 4, many other methods of implementing the example wireless battery management control circuitry 302 of FIG. 3 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

Additionally, while an example manner of implementing the battery circuitry 304A-H is illustrated in FIG. 3, one or more of the elements, processes, and/or devices illustrated in FIG. 3 may be combined, divided, re-arranged, omitted, eliminated, and/or implemented in any other way. Further, the example communication interface circuitry 318A-H, the example monitoring circuitry 320A-H, the example battery balance control circuitry 322A-H, the example battery balance circuitry 324A-H, and/or, more generally, the example battery circuitry 304A-H of FIG. 3, may be implemented by hardware alone or by hardware in combination with software and/or firmware. Thus, for example, any of the example communication interface circuitry 318A-H, the example monitoring circuitry 320A-H, the example battery balance control circuitry 322A-H, the example battery balance circuitry 324A-H, and/or, more generally, the example battery circuitry 304A-H of FIG. 3, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example the example battery circuitry 304A-H of FIG. 3 may include one or more elements, processes, and/or devices in addition to, or instead of, those illustrated in FIG. 3, and/or may include more than one of any or all of the illustrated elements, processes, and devices.

Figure 5:
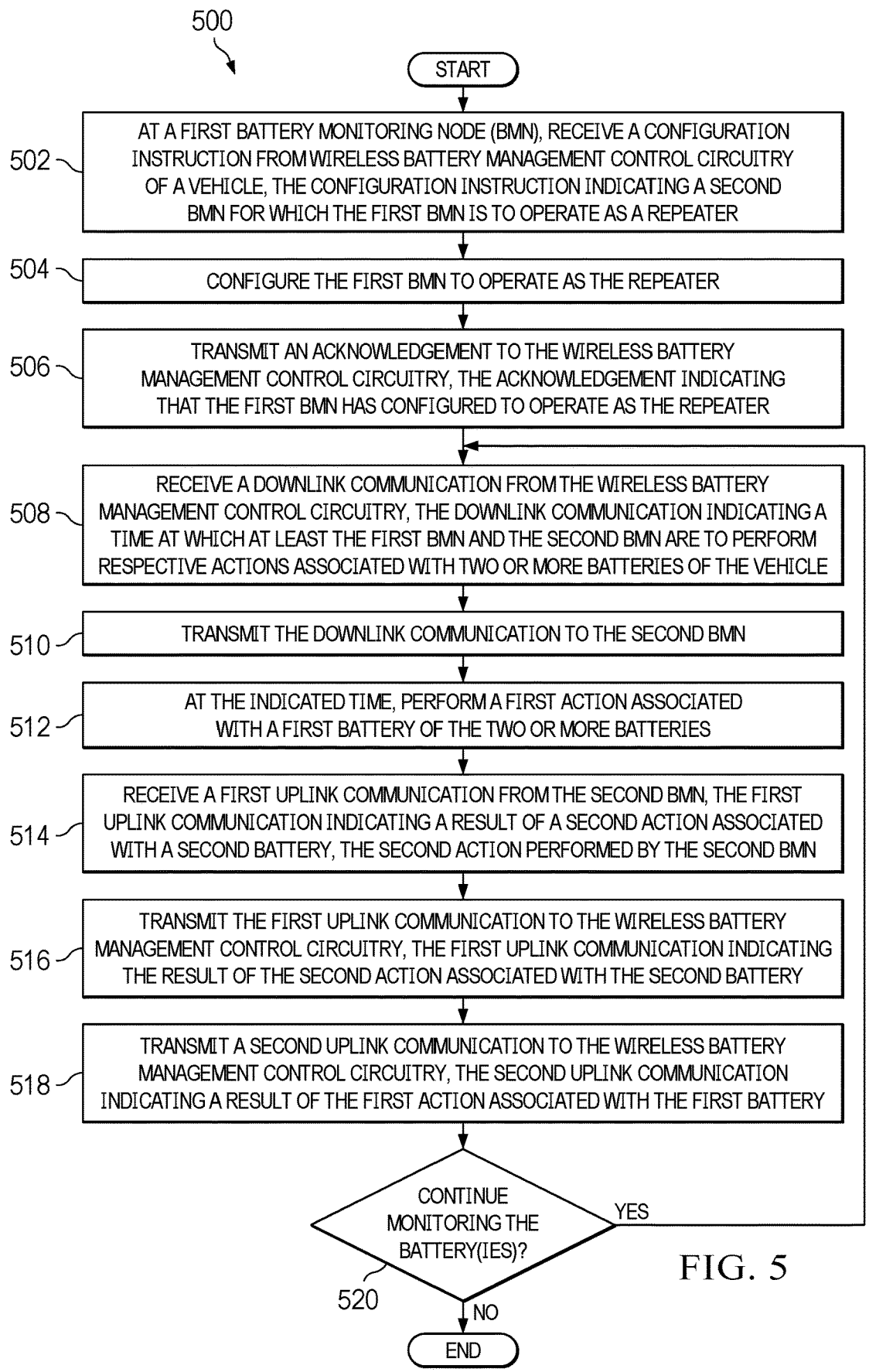
FIG. 5 is a flowchart representative of an example process that may be performed using machine readable instructions that can be executed by processor circuitry and/or hardware circuitry configured to implement the battery circuitry of FIG. 3 to operate as a repeater.
Figure 6:
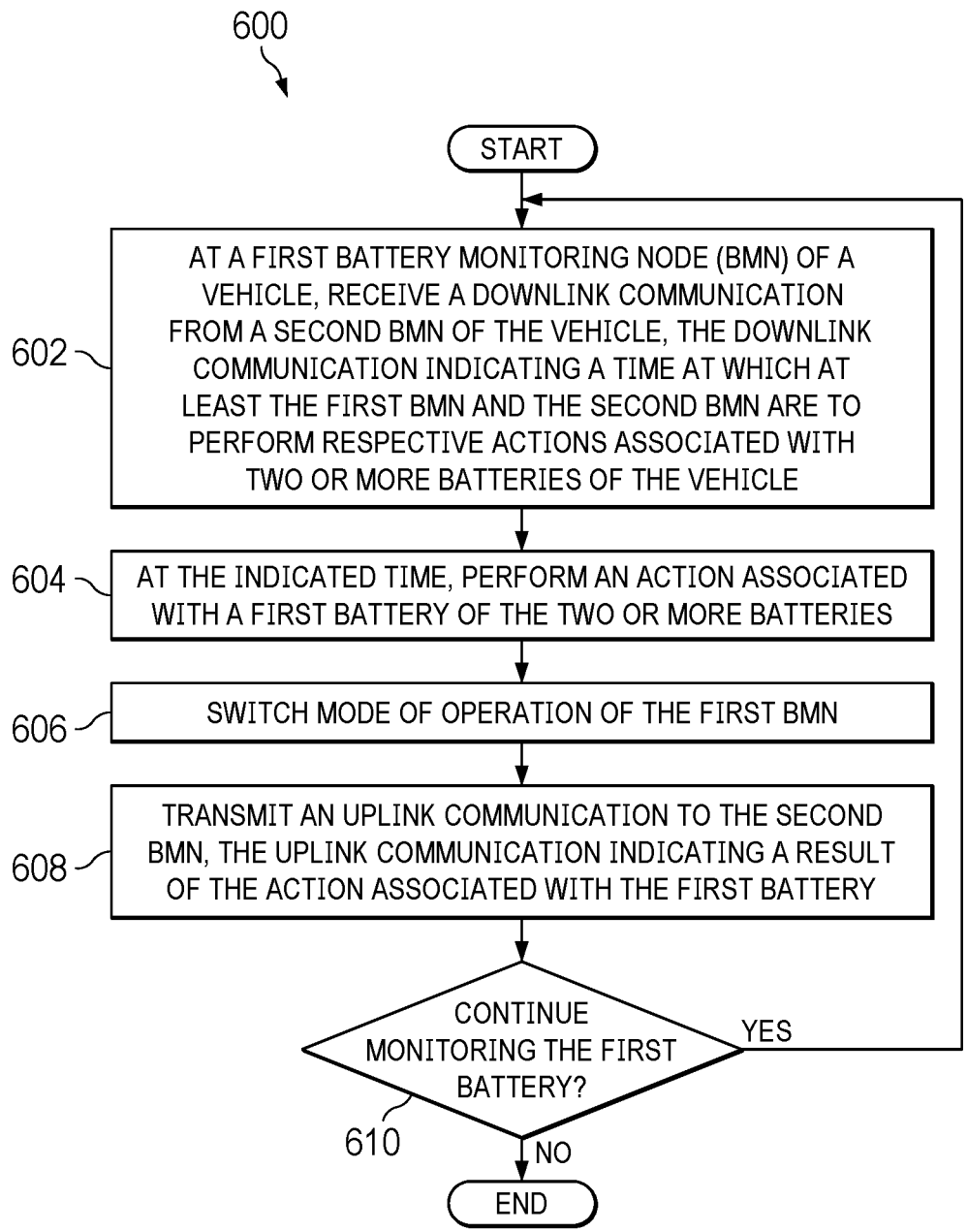
FIG. 6 is a flowchart representative of an example process that may be performed using machine readable instructions that can be executed by processor circuitry and/or hardware circuitry configured to implement the battery circuitry of FIG. 3 to operate when noncommunicative with wireless battery management control circuitry.

Flowcharts representative of example machine readable instructions, which may be executed to configure processor circuitry to implement the example battery circuitry 304A-H of FIG. 3, is shown in FIGS. 5 and 6. The machine readable instructions may be one or more executable programs or portion(s) of an executable program for execution by processor circuitry, such as the processor circuitry 912 shown in the example processor platform 900 discussed below in connection with FIG. 9 and/or the example processor circuitry discussed below in connection with FIGS. 10 and/or 11. The program may be embodied in software stored on one or more non-transitory computer readable storage media such as a CD, a floppy disk, a HDD, a SSD, a DVD, a Blu-ray disk, a volatile memory (e.g., RAM of any type, etc.), or a non-volatile memory (e.g., EEPROM, FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a RAN) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 5 and 6, many other methods of implementing the example battery circuitry 304A-H of FIG. 3 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core CPU), a multi-core processor (e.g., a multi-core CPU, an XPU, etc.) in a single machine, multiple processors distributed across multiple servers of a server rack, multiple processors distributed across one or more server racks, a CPU and/or a FPGA located in the same package (e.g., the same IC package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 4, 5, and/or 6 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory computer readable storage medium, non-transitory machine readable medium, and non-transitory machine readable storage medium are expressly defined to include any type of computer readable storage device and/or storage disk and to exclude propagating signals and to exclude transmission media. As used herein, the terms "computer readable storage device" and "machine readable storage device" are defined to include any physical (mechanical and/or electrical) structure to store information, but to exclude propagating signals and to exclude transmission media. Examples of computer readable storage devices and machine readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine readable instructions, etc., and/or manufactured to execute computer readable instructions, machine readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 4 is a flowchart representative of an example process 400 that may be performed using machine readable instructions that can be executed by processor circuitry and/or hardware circuitry configured to implement the wireless battery management control circuitry 302 of FIG. 3 to operate a wireless battery system to improve one-hop techniques. The process 400 of FIG. 4 begins at block 402, at which the wireless battery control circuitry 312 identifies two or more battery monitoring nodes (e.g., the battery circuitry 304A-H) of a vehicle. To identify the two or more battery monitoring nodes in the wireless battery system 300, the wireless battery control circuitry 312 accesses the first storage 316 to retrieve data representative of a topology of the wireless battery system 300. In other words, the wireless battery control circuitry 312 identifies the two or more battery monitoring nodes based on data representative of the topology of the wireless battery system 300. For example, the topology of the wireless battery system 300 indicates a total number (e.g., eight in FIG. 3) of battery monitoring nodes in the wireless battery system 300.

In the illustrated example of FIG. 4, at block 404, the wireless battery control circuitry 312 detects a first battery monitoring node that is noncommunicative with the wireless battery management control circuitry 302. For example, unlike battery monitoring nodes that are in communication with the wireless battery management control circuitry 302, noncommunicative battery monitoring nodes have lost communication (e.g., are no longer in communication) with the wireless battery management control circuitry 302. For example, a battery monitoring node may be noncommunicative because the first transceiver 328A of the battery monitoring node is damaged, an antenna of the first transceiver 328A is misconfigured, an obstruction and/or interference (e.g., physical and/or electromagnetic) exists between the battery monitoring node and the wireless battery management control circuitry 302, and/or the first transceiver 328A and/or, more generally, the battery monitoring node has degraded (e.g., corroded) over a period of time. In some examples, a battery monitoring node may be classified as noncommunicative (e.g., no longer in communication) with the wireless battery management control circuitry 302 if signals received from the battery monitoring node are below a threshold signal strength. Additionally or alternatively, a battery monitoring node may be classified as noncommunicative (e.g., no longer in communication) with the wireless battery management control circuitry 302 if the wireless battery management control circuitry 302 does not receive a threshold number of acknowledgements from the battery monitoring node over a predefined number of attempted communications (e.g., the battery monitoring node fails to acknowledge successfully transmission of two out of three communications).

In some examples, during an initial set up of the wireless battery system 300 and/or after a reset of the wireless battery system 300, at blocks 402 and 404, the wireless battery control circuitry 312 causes the wireless battery communication circuitry 310 to transmit one or more pings (e.g., ping communications) to the two or more battery monitoring nodes identified in the topology of the wireless battery system 300. Based on the number of responses the wireless battery control circuitry 312 receives from the two or more battery monitoring nodes, the wireless battery control circuitry 312 detects whether any battery monitoring nodes are noncommunicative with the wireless battery management control circuitry 302 (e.g., the difference between the total number of battery monitoring nodes and the number of responses to the ping(s)). Additionally or alternatively, during operation of the wireless battery system 300, at block 404, the wireless battery control circuitry 312 detects a battery monitoring node that is noncommunicative with the wireless battery management control circuitry 302 if communication with the battery monitoring nodes is lost (e.g., based on a determination that the battery monitoring node is no longer in communication with the wireless battery management control circuitry 302) and reconnection with the battery monitoring node is not successful (e.g., failure of the battery monitoring node to reestablish communication with the wireless battery management control circuitry 302).

In the illustrated example of FIG. 4, in response to detecting a first battery monitoring node that is noncommunicative, at block 406, the wireless battery control circuitry 312 selects a second battery monitoring node to operate as a repeater for the first battery monitoring node, the second battery monitoring node being in communication with the wireless battery management control circuitry 302. In the example of FIG. 4, the wireless battery control circuitry 312 selects the second battery monitoring node to operate as the repeater in response to a received signal strength indicator (RSSI) value associated with the second battery monitoring node satisfying a threshold. For example, at block 406, the wireless battery control circuitry 312 selects the second battery monitoring node to operate as the repeater based on an RSSI value of a signal received by the wireless battery management control circuitry 302 from the second battery monitoring node satisfying a threshold. Additionally or alternatively, at block 406, the wireless battery control circuitry 312 selects the second battery monitoring node to operate as the repeater based on an RSSI value of a signal received by the second battery monitoring node (e.g., in communication with the wireless battery management control circuitry 302) from the first battery monitoring node (e.g., noncommunicative) satisfying a threshold. To determine such RSSI values, the wireless battery control circuitry 312 requests the information from the wireless battery communication circuitry 310 or measures the RSSI values based on one or more previous communications received from the first battery monitoring node and/or the second battery monitoring node.

In the illustrated example of FIG. 4, after selecting the second battery monitoring node to operate as the repeater, at block 408, the wireless battery control circuitry 312 causes the wireless battery communication circuitry 310 to transmit (e.g., causes transmission of) a configuration instruction to the second battery monitoring node via the transceiver 317. The configuration instruction (e.g., a reconfiguration instruction) instructs (e.g., is to cause) the second battery monitoring node to operate as a repeater for the first battery monitoring node. For example, via the configuration instruction, the wireless battery control circuitry 312 instructs the second battery monitoring node to transmit a downlink communication to the first battery monitoring node in response to receipt of the downlink communication from the wireless battery communication circuitry 310 (e.g., to repeat the downlink communication to the first battery monitoring node). Additionally, via the configuration instruction, the wireless battery control circuitry 312 instructs the second battery monitoring node to transmit an uplink communication to the wireless battery communication circuitry 310 in response to receipt of the uplink communication from the first battery monitoring node (e.g., to repeat the uplink communication from the first battery monitoring node).

In the illustrated example of FIG. 4, at block 410, the wireless battery control circuitry 312 processes an acknowledgement received by the wireless battery communication circuitry 310 from the second battery monitoring node. In the example of FIG. 4, the acknowledgement indicates that the second battery monitoring node has configured (e.g., reconfigured) itself to operate as the repeater for the first battery monitoring node. Having configured (e.g., reconfigured) the wireless battery system 300 to improve one-hop extension, the wireless battery control circuitry 312 proceeds to operate the wireless battery system 300. For example, at block 412, the wireless battery control circuitry 312 generates a downlink communication to be transmitted to the battery monitoring nodes of the wireless battery system 300. In examples disclosed herein, to improve synchronization when implementing one-hop extension, the wireless battery control circuitry 312 includes in the downlink instruction a time at which the two or more battery monitoring nodes (e.g., the first battery monitoring node and the second battery monitoring node) are to perform respective actions associated with two or more batteries of the vehicle.

For example, the downlink communication indicates a time at which the two or more battery monitoring nodes are to perform respective measurements (current measurements, voltage measurements, temperature measurements, etc.) of two or more batteries of the vehicle. In some examples, the downlink communication indicates a time at which the two or more battery monitoring nodes are to balance and/or re-balance the two or more batteries of the vehicle. In additional or alternative examples, the downlink communication indicates a time at which the two or more battery monitoring nodes are to perform load balancing of the two or more batteries of the vehicle. In some examples, the downlink communication indicates a time at which the two or more battery monitoring nodes are to perform cooling of the two or more batteries of the vehicle. In additional or alternative examples, the downlink communication indicates a time at which two or more battery monitoring nodes are to open and/or close one or more relays coupled to a motor powered by the two or more batteries of the vehicle.

In some examples, the downlink communication indicates a time at which two or more battery monitoring nodes are to perform a diagnostic test (e.g., a safety diagnostic test, a wireless diagnostic test, etc.) associated with the two or more batteries of the vehicle. In additional or alternative examples, the downlink communication indicates a time at which two or more battery monitoring nodes are to provide an ID associated with the two or more batteries of the vehicle.

In the illustrated example of FIG. 4, the indicated time is based on an expected time (e.g., delay) associated with repeating the downlink communication to the first battery monitoring node. In some examples, the indicated time can be extended to accommodate repeating the downlink communication to multiple noncommunicative battery monitoring nodes. With the second battery monitoring node configured to repeat the downlink Communication to the first battery monitoring node and the indicated time at which to perform the action, actions (e.g., measurements) performed by the two or more battery monitoring nodes of the vehicle will be synchronized despite the fact that the first battery monitoring node is noncommunicative with the wireless battery management control circuitry 302.

In the illustrated example of FIG. 4, at block 414, the wireless battery control circuitry 312 causes the wireless battery communication circuitry 310 to transmit (e.g., causes transmission of) the first downlink communication to the second battery monitoring node. At block 416, the wireless battery control circuitry 312 processes one or more uplink communications received by the wireless battery communication circuitry 310 via the transceiver 317 from at least the second battery monitoring node. At block 418, the wireless battery control circuitry 312 extracts and/or otherwise identifies data from the one or more uplink communications. For example, the wireless battery control circuitry 312 extracts and/or otherwise identifies measurement data, which may include amperage measurement(s), voltage measurement(s), temperature measurement(s), etc., and/or a combination thereof, from the one or more uplink communications. In additional or alternative examples, the wireless battery control circuitry 312 extracts and/or otherwise identifies any other data from the one or more uplink communications. At block 420, at least one of the wireless battery communication circuitry 310 or the wireless battery control circuitry 312 stores the data in the first storage 316 of FIG. 3.

In the illustrated example of FIG. 4, at block 422, the wireless battery control circuitry 312 determines whether uplink communication(s) corresponding to the two or more battery monitoring nodes have been received or a timeout has been reached. For example, if the wireless battery control circuitry 312 determines that an uplink communication has not been received during an expected time period (e.g., a timeout time period, a timeout timer has expired, etc.) for a battery monitoring node that was previously in communication with the wireless battery control circuitry 312, then the wireless battery control circuitry 312 identifies the battery monitoring node as noncommunicative as described above with respect to blocks 402 and 404. If, at block 422, the wireless battery control circuitry 312 determines that uplink communication(s) corresponding to the two or more battery monitoring nodes have not been received and timeout has not been reached (block 422: NO), control returns to block 416 to continue to wait for the uplink communication(s) from the two or more battery monitoring nodes.

In the illustrated example of FIG. 4, if, at block 422, the wireless battery control circuitry 312 determines that uplink communication(s) corresponding to the two or more battery monitoring nodes have been received and/or timeout has been reached (block 422: YES), then, at block 424, the vehicle communication circuitry 314 of FIG. 3 retrieves data (e.g., performance data, measurement data, etc.) corresponding to the two or more battery monitoring nodes from the first storage 316. In some such examples, the vehicle communication circuitry 314 provides, delivers, and/or otherwise transmits the data (e.g., performance data, the measurement data, etc.) to the ECU 308 of FIG. 3 via the vehicle communication bus 306 of FIG. 3. At block 426, the wireless battery control circuitry 312 determines whether to continue monitoring the two or more batteries. If, at block 426, the wireless battery control circuitry 312 determines to continue monitoring the two or more batteries (block 426: YES), control returns to block 412 to generate downlink communication(s). Otherwise (block 426: NO), the example process 400 of FIG. 4 concludes.

FIG. 5 is a flowchart representative of an example process 500 that may be performed using machine readable instructions that can be executed by processor circuitry and/or hardware circuitry configured to implement the battery circuitry 304A-H of FIG. 3 to operate as a repeater. The process 500 of FIG. 5 will be described with respect to first battery circuitry 304A of the battery circuitry 304A-H. The first battery circuitry 304A includes the first communication interface circuitry 318A, the first monitoring circuitry 320A, the first battery balance control circuitry 322A, the first battery balance circuitry 324A, the first storage instance 326A of the second storage 326A-H, and the first transceiver 328A. In the example of FIG. 5, the first battery circuitry 304A is coupled to the first battery 327A. In the example of FIG. 5, the first battery circuitry 304A is referred to as a first battery monitoring node.

In the illustrated example of FIG. 5, the process 500 of FIG. 5 begins at block 502, at which the first monitoring circuitry 320A processes a configuration instruction received by the first communication interface circuitry 318A, via the first transceiver 328A, from the wireless battery management control circuitry 302 of a vehicle. In the example of FIG. 5, the configuration instruction (e.g., a reconfiguration instruction) indicates a second battery monitoring node for which the first battery monitoring node (e.g., the first battery circuitry 304A) is to operate as a repeater. At block 504, the first monitoring circuitry 320A configures (e.g., reconfigures) the first battery monitoring node (e.g., the first battery circuitry 304A) to operate as the repeater. For example, to configure (e.g., reconfigure) the first battery monitoring node, the first monitoring circuitry 320A instructs the first communication interface circuitry 318A to transmit a downlink communication to the second battery monitoring node in response to receipt of the downlink communication from the wireless battery communication circuitry 310 (e.g., to repeat the downlink communication to the second battery monitoring node). Additionally, to configure (e.g., reconfigure) the first battery monitoring node, the first monitoring circuitry 320A instructs the first communication interface circuitry 318A to transmit an uplink communication to the wireless battery communication circuitry 310 in response to receipt of the uplink communication from the second battery monitoring node (e.g., to repeat the uplink communication from the second battery monitoring node).

In the illustrated example of FIG. 5, at block 506, the first monitoring circuitry 320A instructs the first communication interface circuitry 318A to transmit (e.g., causes transmission of) an acknowledgement to the wireless battery management control circuitry 302 (e.g., the wireless battery communication circuitry 310). In the example of FIG. 5, the acknowledgement indicates that the first battery monitoring node has configured (e.g., reconfigured) itself to operate as the repeater for the second battery monitoring node. At block 508, the first monitoring circuitry 320A processes a downlink communication received by the first communication interface circuitry 318A, via the first transceiver 328A, from the wireless battery management control circuitry 302. As described above, the downlink communication includes an indication of a time at which the two or more battery monitoring nodes (e.g., the first battery monitoring node and the second battery monitoring node) are to perform respective actions associated with two or more batteries of the vehicle. For example, the downlink communication includes an indication of a time at which two or more battery monitoring nodes are to perform respective measurements of the two or more batteries of the vehicle. In additional or alternative examples, the downlink communication includes an indication of a time at which two or more battery monitoring nodes are to perform any other type of action associated with two or more batteries of the vehicle.

In the illustrated example of FIG. 5, at block 510, based on the configuration, the first monitoring circuitry 320A instructs the first communication interface circuitry 318A to transmit (e.g., causes transmission of) the downlink communication to the second battery monitoring node. In this manner, the first monitoring circuitry 320A and/or, more generally, the first battery monitoring node (e.g., the first battery circuitry 304A) repeats the downlink communication to the second battery monitoring node. At block 512, circuitry of the first batter monitoring node performs a first action associated with the first battery 327A at the time indicated in the downlink communication. In the example of FIG. 5, the example indicated time is based on an expected time (e.g., delay) associated with the first monitoring circuitry 320A repeating the downlink communication to the second battery monitoring node.

As described above, many different actions may be performed at the time indicated in the downlink communication. For example, at block 512, sensor circuitry at least the first battery balance circuitry 324A performs a first measurement of the first battery 327A at the time indicated in the downlink communication. In additional or alternative examples, at block 512, the first battery balance control circuitry 322A and/or the first battery balance circuitry 324A balance and/or re-balance charge levels of the first battery 327A at the time indicated in the downlink communication. In some examples, at block 512, the first battery balance control circuitry 322A and/or the first battery balance circuitry 324A and/or corresponding battery balance control circuitry and/or battery balance circuitry of other battery monitoring nodes load balance the first battery 327A and/or other batteries of the vehicle at the time indicated in the downlink communication. In additional or alternative examples, at block 512, the first battery balance control circuitry 322A and/or the first battery balance circuitry 324A cool the first battery 327A at the time indicated in the downlink communication. In some examples, at block 512, the first battery balance control circuitry 322A opens and/or closes a relay coupled to a motor powered by the first battery 327A at the time indicated in the downlink communication. In additional or alternative examples, at block 512, the first monitoring circuitry 320A completes a device safety diagnostic test at the time indicated in the downlink communication. In some examples, at block 512, the first communication interface circuitry 318A completes a wireless diagnostic test at the time indicated in the downlink communication. In additional or alternative examples, at block 512, the first communication interface circuitry 318A provides an ID of the first battery monitoring node at the time indicated in the downlink communication.

In the illustrated example of FIG. 5, at block 514, the first monitoring circuitry 320A processes a first uplink communication received by the first communication interface circuitry 318A, via the first transceiver 328A, from the second battery monitoring node (e.g., the noncommunicative battery monitoring node). In the example of FIG. 5, the first uplink communication indicates a result of a second action associated with a second battery of the vehicle, the second action performed by the second battery monitoring node. For example, the first uplink communication indicates a result of a second measurement of the second battery of the vehicle, the second measurement performed by the second battery monitoring node. In additional or alternative examples, the first uplink communication indicates a result of any other action associated with the second battery of the vehicle, the second action performed by the second battery monitoring node. At block 516, the first monitoring circuitry 320A instructs the first communication interface circuitry 318A to transmit (e.g., causes transmission of) the first uplink communication to the wireless battery management control circuitry 302. In this manner, the first monitoring circuitry 320A and/or, more generally, the first battery monitoring node (e.g., the first battery circuitry 304A) repeats the first uplink communication to the first battery monitoring node. Advantageously, as the first battery monitoring node repeated the downlink communication to the second battery monitoring node including the indicated time at which to perform respective measurements, measurements (the first and second measurements) performed by the two or more battery monitoring nodes of the vehicle will be synchronized despite the fact that the second battery monitoring node is noncommunicative with the wireless battery management control circuitry 302.

In the illustrated example of FIG. 5, at block 518, the first monitoring circuitry 320A instructs the first communication interface circuitry 318A to transmit (e.g., causes transmission of) a second uplink communication to the wireless battery management control circuitry 302. In the example of FIG. 5, the second uplink communication indicates a result of the first action associated with the first battery performed by the first battery monitoring node. At block 520, the first monitoring circuitry 320A determines whether to continue monitoring the two or more batteries. If, at block 520, the first monitoring circuitry 320A determines to continue monitoring the two or more batteries (block 520: YES), control returns to block 508 to receive a downlink communication from the wireless battery management control circuitry 302. Otherwise (block 520: NO), the example process 500 of FIG. 5 concludes.

In the illustrated example of FIG. 5, the first monitoring circuitry causes transmission of the first uplink communication (including the result of the second action performed by the second battery monitoring node) (e.g., block 516) before causing transmission of the second uplink communication (including the result of the first action performed by the first battery monitoring node) (e.g., block 518) to avoid any issues associated with the first storage instance 326A of the second storage 326A-H buffering the first uplink communication. However, other configurations are possible. For example, the first monitoring circuitry 320A may aggregates the result of the first action and the result of the second action in one uplink communication sent to the wireless battery management control circuitry 302.

FIG. 6 is a flowchart representative of an example process 600 that may be performed using machine readable instructions that can be executed by processor circuitry and/or hardware circuitry configured to implement the battery circuitry 304A-H of FIG. 3 to operate when noncommunicative with the wireless battery management control circuitry 302. The process 600 of FIG. 6 will be described with respect to second battery circuitry 304B of the battery circuitry 304A-H. The second battery circuitry 304B includes second communication interface circuitry 318B, second monitoring circuitry 320B, second battery balance control circuitry 322B, second battery balance circuitry 324B, a second storage instance 326B of the second storage 326A-H, and a second transceiver 328B. In the example of FIG. 6, the second battery circuitry 304B is coupled to the second battery 327B. In the example of FIG. 6, the second battery circuitry 304B is referred to as a first battery monitoring node.

In the illustrated example of FIG. 6, at least the second transceiver 328B is the transceiver is noncommunicative with the wireless battery management control circuitry 302 due to at least one of the second transceiver 328B being damaged, an antenna of the second transceiver 328B being misconfigured, interference between the first battery monitoring node and the wireless battery management control circuitry 302, or degradation of at least one of the second transceiver 328B or the first battery monitoring node over a period of time. In the example of FIG. 6, the process 600 begins at block 602, at which the second monitoring circuitry 320B processes a downlink communication received by the second communication interface circuitry 318B, via the second transceiver 328B, from a second battery monitoring node (e.g., the first battery circuitry 304A) of a vehicle. Included with the downlink communication is an indication of a time at which at the first battery monitoring node and the second battery monitoring node are to perform respective actions associated with two or more batteries (e.g., the first battery 327A and the second battery 327B) of the vehicle.

As described above, many different actions may be performed at the time indicated in the downlink communication. For example, at block 604, sensor circuitry of at least the second battery balance circuitry 324B performs a first measurement of the first battery (e.g., the second battery 327B) of the two or more batteries at the time indicated in the downlink communication. In additional or alternative examples, at block 604, the second battery balance control circuitry 322B and/or the second battery balance circuitry 324B balance and/or re-balance charge levels of the second battery 327B at the time indicated in the downlink communication. In some examples, at block 604, the second battery balance control circuitry 322B and/or the second battery balance circuitry 324B and/or corresponding battery balance control circuitry and/or battery balance circuitry of other battery monitoring nodes load balance the second battery 327B and/or other batteries of the vehicle at the time indicated in the downlink communication. In additional or alternative examples, at block 604, the second battery balance control circuitry 322B and/or the second battery balance circuitry 324B cool the second battery 327B at the time indicated in the downlink communication. In some examples, at block 604, the second battery balance control circuitry 322B opens and/or closes a relay coupled to a motor powered by the second battery 327B at the time indicated in the downlink communication. In additional or alternative examples, at block 604, the second monitoring circuitry 320B completes a device safety diagnostic test at the time indicated in the downlink communication. In some examples, at block 604, the second communication interface circuitry 318B completes a wireless diagnostic test at the time indicated in the downlink communication. In additional or alternative examples, at block 604, the second communication interface circuitry 318B provides an ID of the first battery monitoring node at the time indicated in the downlink communication.

In the illustrated example of FIG. 6, at block 604, circuitry of the first battery monitoring node performs a first action associated with a first battery (e.g., the second battery 327B) of the two or more batteries at the time indicated in the downlink communication. Advantageously, as the downlink communication from the second battery monitoring node included the indicated time at which to perform respective actions (e.g., measurements), actions performed by the two or more battery monitoring nodes of the vehicle will be synchronized despite the fact that the first battery monitoring node is noncommunicative with the wireless battery management control circuitry 302. In the example of FIG. 6, at block 606, the second communication interface circuitry 318B switches from a receive mode of operation to a transmit mode of operation.

In the illustrated example of FIG. 6, at block 608, the second monitoring circuitry 320B instructs the second communication interface circuitry 318B to transmit (e.g., causes transmission of) an uplink communication to second battery monitoring node. In the example of FIG. 6, the uplink communication indicates a result of the action associated with the first battery. For example, in response to receiving the downlink communication from the second battery monitoring node, the second monitoring circuitry 320B identifies the second battery monitoring node as the entity to which to send the uplink communication. In some examples, the second monitoring circuitry 320B identifies the second battery monitoring node based on an indication of the receiver address of the second battery monitoring node included in the downlink communication. Additionally or alternatively, the second battery monitoring node (e.g., the first battery circuitry 304A) broadcasts the downlink communication and includes additionally information (e.g., one or more bits, a flag, etc.) identifying the downlink communication as a one-hop extension communication. Based on the additional information the second monitoring circuitry 320B identifies the second battery monitoring node.

In the illustrated example of FIG. 6, at block 610, the second monitoring circuitry 320B determines whether to continue monitoring the first battery. If, at block 610, the second monitoring circuitry 320B determines to continue monitoring the first battery (block 610: YES), control returns to block 602 to receive a downlink communication from the second battery monitoring node. Otherwise (block 610: NO), the example process 600 of FIG. 6 concludes.

Figure 7:
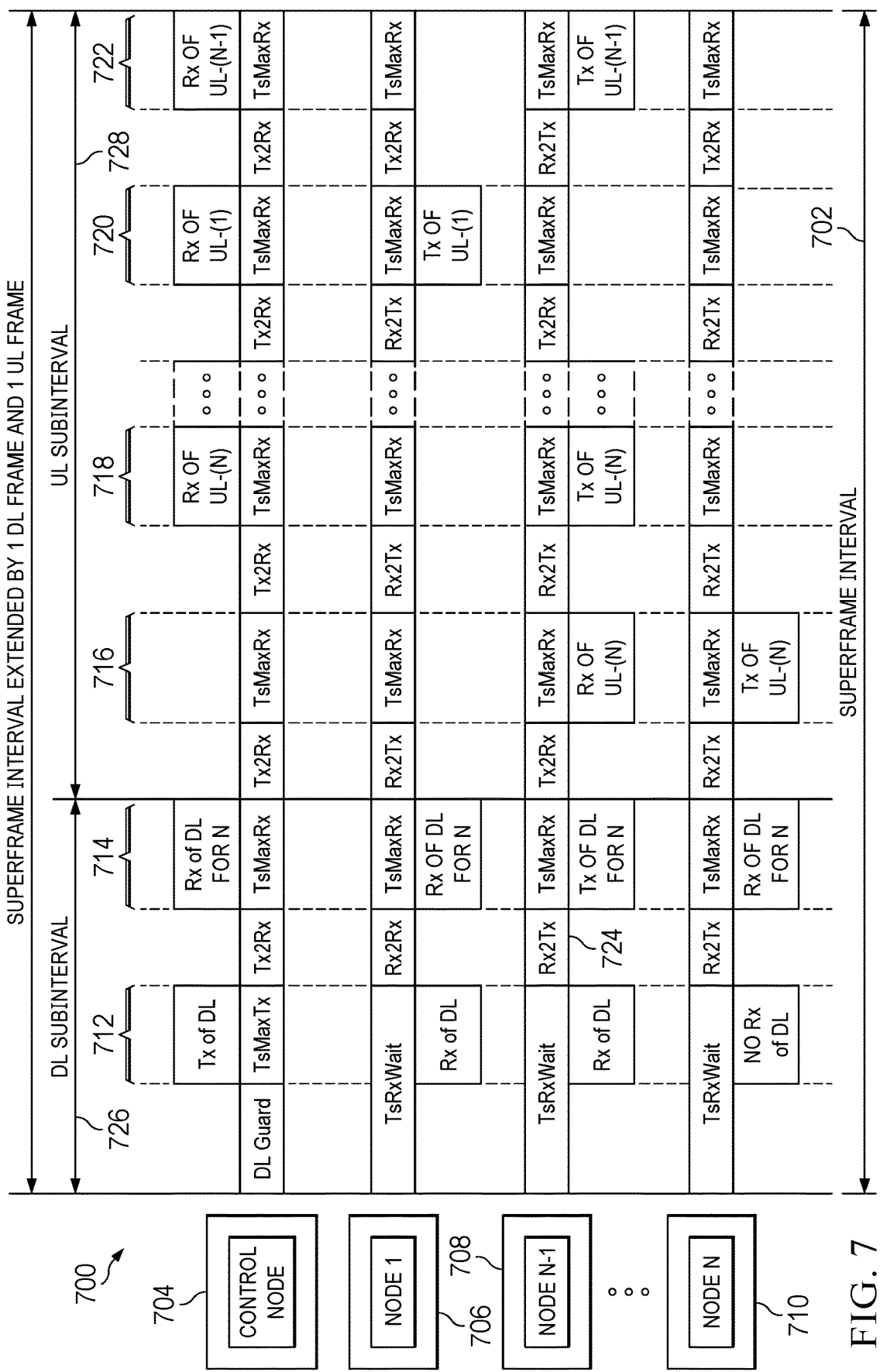
FIG. 7 depict an example timing diagram of an example superframe interval according to one-hop techniques disclosed herein.

FIG. 7 depict an example timing diagram 700 of an example superframe interval 702 according to one-hop techniques disclosed herein. The timing diagram 700 illustrates communication operations associated with an example control node 704, an example first battery monitoring node (NODE 1) 706, an example second battery monitoring node (NODE N-1) 708, and an example third battery monitoring node (NODE N) 710 implementing one-hop techniques disclosed herein. For example, the control node 704 may be implemented by the wireless battery management control circuitry 302 of FIG. 3 or portion(s) thereof. In some examples, the first battery monitoring node 706 may be implemented by third battery circuitry 304C of the battery circuitry 304A-H of FIG. 3 or portion(s) thereof. In some examples, the second battery monitoring node 708 may be implemented by the first battery circuitry 304A of the battery circuitry 304A-H of FIG. 3 or portion(s) thereof. In some examples, the third battery monitoring node 710 may be implemented by the second battery circuitry 304B of the battery circuitry 304A-H of FIG. 3 or portion(s) thereof.

In the illustrated example of FIG. 7, the superframe interval 702 corresponds to an interval of operation of an example wireless battery system including the control node 704, the first battery monitoring node 706, the second battery monitoring node 708, and the third battery monitoring node 710. In the example of FIG. 7, the control node 704 subdivides the superframe interval 702 into one or more uplink frames and/or one or more downlink frames. For example, the superframe interval 702 includes an example first downlink frame 712, an example second downlink frame 714, an example first uplink frame 716, an example second uplink frame 718, an example third uplink frame 720, and an example fourth uplink frame 722. In subdividing the superframe interval 702, the control node 704 includes a transmission interval after each uplink frame and each downlink frame to allow for circuitry to switch between uplink and downlink modes of operation. For example, the control node 704 includes an example switch frame 724 between the first downlink frame 712 and the second downlink frame 714.

In example operation, during the first downlink frame 712, the control node 704 transmits a downlink (DL) communication to the first battery monitoring node 706, the second battery monitoring node 708, and the third battery monitoring node 710. For example, the DL communication includes an instruction to monitor batteries associated with the first battery monitoring node 706, the second battery monitoring node 708, and the third battery monitoring node 710. In the first downlink frame 712, transmission of the DL communication by the control node 704 is represented by a transmit frame (TsMaxTx). In the first downlink frame 712, reception of the DL communication by the battery monitoring nodes is represented by a receive frame (TsRxWait). In the example of FIG. 7, during the first downlink frame 712, the third battery monitoring node 710 does not receive the DL communication (NO Rx of DL). As disclosed herein, the control node 704 advantageously identifies the third battery monitoring node 710 as noncommunicative and selects the second battery monitoring node 708 to operate as a repeater for the third battery monitoring node 710. Additionally, in the DL communication, the control node 704 indicates a time at which the first battery monitoring node 706, the second battery monitoring node 708, and the third battery monitoring node 710 are to perform the measurement.

Accordingly, during the switch frame 724, the second battery monitoring node 708 switches from a receive mode of operation to a transmit mode of operation (Rx2Tx). During the second downlink frame 714, the second battery monitoring node 708 transmits the DL communication to the third battery monitoring node 710. In the example of FIG. 7, the second battery monitoring node 708 broadcasts the DL communication and indicates (e.g., via acknowledgement bits) the battery monitoring node to which the repeated DL communication corresponds. As such, an example DL subinterval 726 of the superframe interval 702 has been extended by one DL frame to allow for the second battery monitoring node 708 to transmit the DL communication to the third battery monitoring node 710 (e.g., that is noncommunicative). The number of DL frames added to the DL subinterval 726 may vary depending on the number of noncommunicative battery monitoring nodes.

In the illustrated example of FIG. 7, in example operation, during the first uplink frame 716, the third battery monitoring node 710 transmits an UL communication to the second battery monitoring node 708. For example, the UL communication includes results of the third battery monitoring node 710 executing the instruction received from the control node 704 via the second battery monitoring node 708 during the second downlink frame 714. In the first uplink frame 716, transmission of the UL communication by the third battery monitoring node 710 is represented by a transmit frame (TsMaxRx). In the first uplink frame 716, reception of the UL communication by the second battery monitoring node 708 is represented by a receive frame (TsMaxRx).

In the illustrated example of FIG. 7, during the second uplink frame 718, the second battery monitoring node 708 transmits the UL communication from the third battery monitoring node 710 to the control node 704. The UL communication received by the control node 704 during the second uplink frame 718 indicates the result of a measurement performed by the third battery monitoring node 710. During the third uplink frame 720, the control node 704 receive an UL communication from the first battery monitoring node 706. The UL communication received by the control node 704 during the third uplink frame 720 indicates the result of a measurement performed by the first battery monitoring node 706. During the fourth uplink frame 722, the control node 704 receive an UL communication from the second battery monitoring node 708. The UL communication received by the control node 704 during the fourth uplink frame 722 indicates the result of a measurement performed by the second battery monitoring node 708.

As illustrated in FIG. 7, an example UL subinterval 728 of the superframe interval 702 has been extended by one UL frame to allow for the second battery monitoring node 708 to transmit the UL communication from the third battery monitoring node 710 (e.g., that is noncommunicative) to the control node 704. The number of UL frames added to the UL subinterval 728 may vary depending on the number of noncommunicative battery monitoring nodes. In general, in FIG. 7, measurements by the battery monitoring nodes are performed after the second downlink frame 714 (e.g., at the time specified in the DL communication) and noncommunicative battery monitoring nodes transmit UL communications to corresponding repeaters before communicative battery monitoring noes transmit UL communications. Additionally, as described above, repeater battery monitoring nodes repeat UL communications from noncommunicative battery monitoring nodes before transmitting their UL communications to avoid any issues associated with buffering UL communications from the noncommunicative battery monitoring nodes. In this manner, examples disclosed herein advantageously improve synchronization of data measurements across wireless battery management networks.

Figure 8:
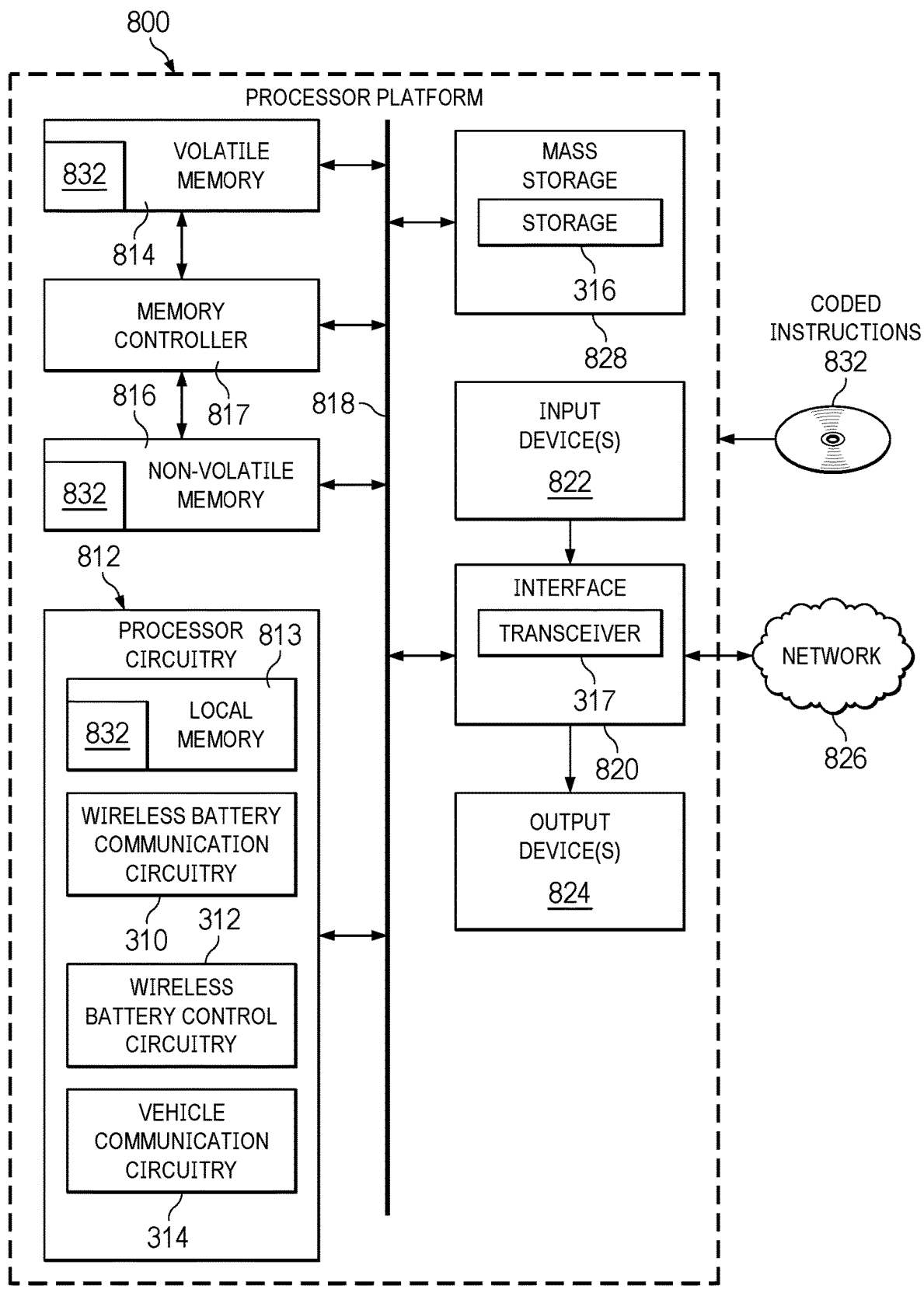
FIG. 8 is a block diagram of an example processing platform including processor circuitry structured to execute the example machine readable instructions of FIGS. 4-6 to implement the example wireless battery management control circuitry of FIG. 3.

FIG. 8 is a block diagram of an example processing platform including processor circuitry structured to execute and/or instantiate machine readable instructions representative of the example processes of FIGS. 4-6 to implement the example wireless battery management control circuitry 302 of FIG. 3. The processor platform 800 can be, for example, a server, a personal computer, a workstation, a self-learning machine (e.g., a neural network), an ECU, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 800 of the illustrated example includes processor circuitry 812. The processor circuitry 812 of the illustrated example is hardware. For example, the processor circuitry 812 can be implemented by one or more integrated circuits, logic circuits, FPGAs microprocessors, CPUs, GPUs, DSPs, and/or microcontrollers from any desired family or manufacturer. The processor circuitry 812 may be implemented by one or more semiconductor based (e.g., silicon based) devices. In this example, the processor circuitry 812 implements the example wireless battery communication circuitry 310, the example wireless battery control circuitry 312, and the example vehicle communication circuitry 314 of FIG. 3.

The processor circuitry 812 of the illustrated example includes a local memory 813 (e.g., a cache, registers, etc.). In some examples, the local memory 813 is implemented as a single level cache. In additional or alternative examples, the local memory 813 is implemented as a multi-level cache. The processor circuitry 812 of the illustrated example is in communication with a main memory including a volatile memory 814 and a non-volatile memory 816 by a bus 818. The volatile memory 814 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 816 may be implemented by flash memory and/or any other desired type of memory device. Access to the main memory 814, 816 of the illustrated example is controlled by a memory controller 817.

The processor platform 800 of the illustrated example also includes interface circuitry 820. The interface circuitry 820 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 822 are connected to the interface circuitry 820. The input device(s) 822 permit(s) a user to enter data and/or commands into the processor circuitry 812. The input device(s) 822 can be implemented by, for example, an audio sensor, a microphone, a camera (still or video), a keyboard, a button, a mouse, a touchscreen, a track-pad, a trackball, an isopoint device, and/or a voice recognition system.

One or more output devices 824 are also connected to the interface circuitry 820 of the illustrated example. The output devices 824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a heads-up display (HUD), a printer, and/or speaker. The interface circuitry 820 of the illustrated example, thus, typically includes a graphics driver card, a graphics driver chip, and/or graphics processor circuitry such as a GPU.

The interface circuitry 820 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 826. The communication can be by, for example, an Ethernet connection, a digital subscriber line (DSL) connection, a telephone line connection, a coaxial cable system, a satellite system, a line-of-site wireless system, a cellular telephone system, an optical connection, etc. In this example, the interface circuitry 820 implements the transceiver 317 of FIG. 3. In some examples, data received via the one or more input devices 822 and/or provided to the one or more output devices 824 is preprocessed (e.g., interpreted) by the processor circuitry 812 before being provided to the transceiver 317.

The processor platform 800 of the illustrated example also includes one or more mass storage devices 828 to store software and/or data. Examples of such mass storage devices 828 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives. In this example, the one or more mass storage devices 828 implement the first storage 316 of FIG. 3.

The machine executable instructions 832, which may be implemented by machine readable instructions representative of the processes of FIGS. 4-6, may be stored in the mass storage device 828, in the volatile memory 814, in the non-volatile memory 816, and/or on a removable non-transitory computer readable storage medium such as a CD or DVD.

Figure 9:
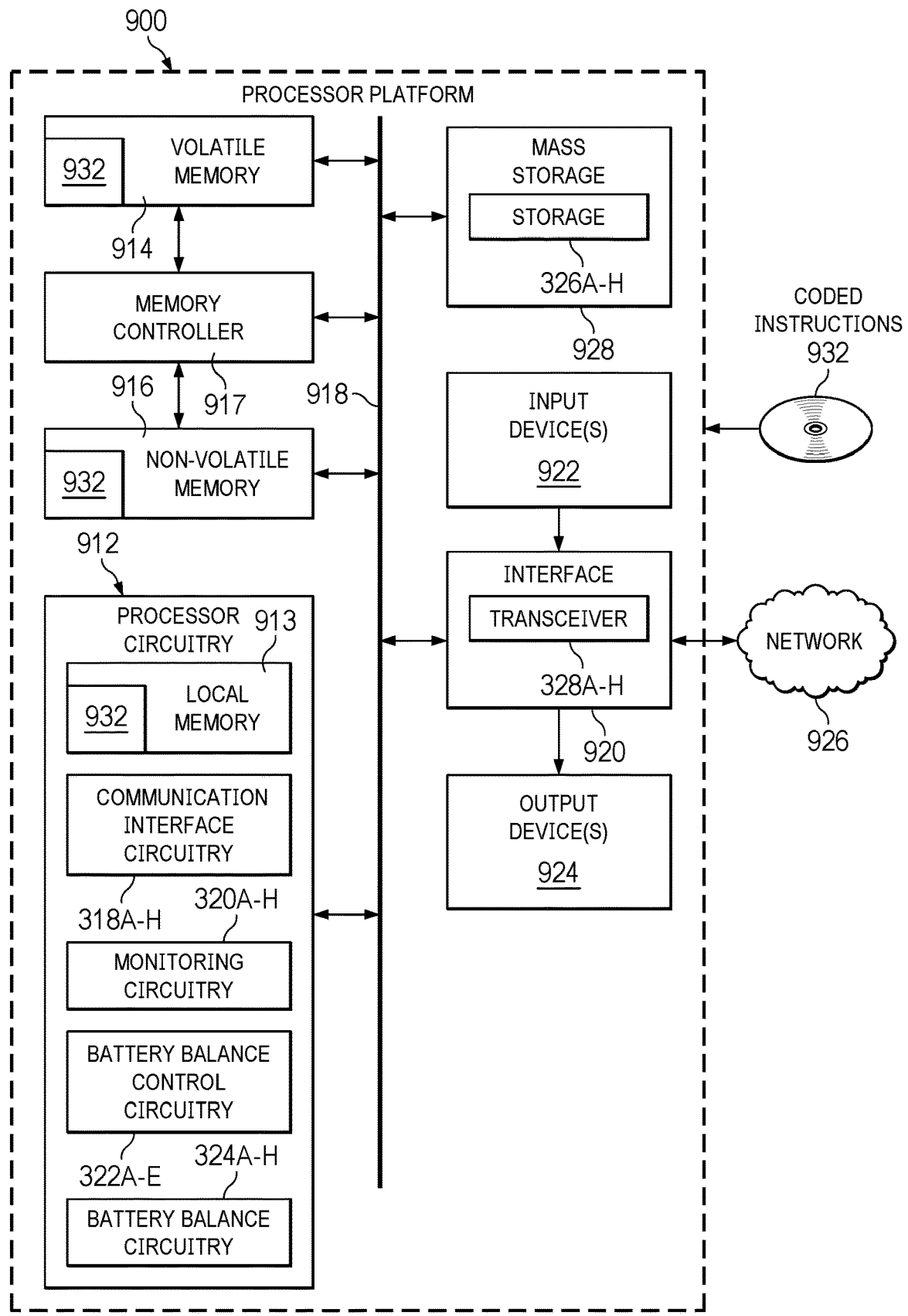
FIG. 9 is a block diagram of an example processing platform including processor circuitry structured to execute the example machine readable instructions of FIGS. 4-6 to implement the example battery circuitry of FIG. 3.

FIG. 9 is a block diagram of an example processing platform including processor circuitry structured to execute and/or instantiate machine readable instructions representative of the example processes of FIGS. 4-6 to implement the example battery circuitry 304A-H of FIG. 3. The processor platform 900 can be, for example, a server, a personal computer, a workstation, a self-learning machine (e.g., a neural network), an ECU, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 900 of the illustrated example includes processor circuitry 912. The processor circuitry 912 of the illustrated example is hardware. For example, the processor circuitry 912 can be implemented by one or more integrated circuits, logic circuits, FPGAs microprocessors, CPUs, GPUs, DSPs, and/or microcontrollers from any desired family or manufacturer. The processor circuitry 912 may be implemented by one or more semiconductor based (e.g., silicon based) devices. In this example, the processor circuitry 912 implements the example communication interface circuitry 318A-H, the example monitoring circuitry 320A-H, the example battery balance control circuitry 322A-H, and the example battery balance circuitry 324A-H of FIG. 3.

The processor circuitry 912 of the illustrated example includes a local memory 913 (e.g., a cache, registers, etc.). In some examples, the local memory 913 is implemented as a single level cache. In additional or alternative examples, the local memory 913 is implemented as a multi-level cache. The processor circuitry 912 of the illustrated example is in communication with a main memory including a volatile memory 914 and a non-volatile memory 916 by a bus 918. The volatile memory 914 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 916 may be implemented by flash memory and/or any other desired type of memory device. Access to the main memory 914, 916 of the illustrated example is controlled by a memory controller 917.

The processor platform 900 of the illustrated example also includes interface circuitry 920. The interface circuitry 920 may be implemented by hardware in accordance with any type of interface standard, such as an Ethernet interface, a USB interface, a Bluetooth® interface, a NFC interface, a PCI interface, and/or a PCIe interface.

In the illustrated example, one or more input devices 922 are connected to the interface circuitry 920. The input device(s) 922 permit(s) a user to enter data and/or commands into the processor circuitry 912. The input device(s) 922 can be implemented by, for example, an audio sensor, a microphone, a camera (still or video), a keyboard, a button, a mouse, a touchscreen, a track-pad, a trackball, an isopoint device, and/or a voice recognition system.

One or more output devices 924 are also connected to the interface circuitry 920 of the illustrated example. The output devices 924 can be implemented, for example, by display devices (e.g., an LED, an OLED, a LCD, a CRT display, an IPS display, a touchscreen, etc.), a tactile output device, a HUD, a printer, and/or speaker. The interface circuitry 920 of the illustrated example, thus, typically includes a graphics driver card, a graphics driver chip, and/or graphics processor circuitry such as a GPU.

The interface circuitry 920 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 926. The communication can be by, for example, an Ethernet connection, a DSL connection, a telephone line connection, a coaxial cable system, a satellite system, a line-of-site wireless system, a cellular telephone system, an optical connection, etc. In this example, the interface circuitry 920 implements the transceivers 328A-H of FIG. 3. In some examples, data received via the one or more input devices 922 and/or provided to the one or more output devices 924 is preprocessed (e.g., interpreted) by the processor circuitry 912 before being provided to the transceivers 328A-H.

The processor platform 900 of the illustrated example also includes one or more mass storage devices 928 to store software and/or data. Examples of such mass storage devices 928 include magnetic storage devices, optical storage devices, floppy disk drives, HDDs, CDs, Blu-ray disk drives, RAID systems, solid state storage devices such as flash memory devices and/or SSDs, and DVD drives. In this example, the one or more mass storage devices 928 implement the second storage 326A-H of FIG. 3.

The machine executable instructions 932, which may be implemented by machine readable instructions representative of the processes of FIGS. 4-6, may be stored in the mass storage device 928, in the volatile memory 914, in the non-volatile memory 916, and/or on a removable non-transitory computer readable storage medium such as a CD or DVD.

Figure 10:
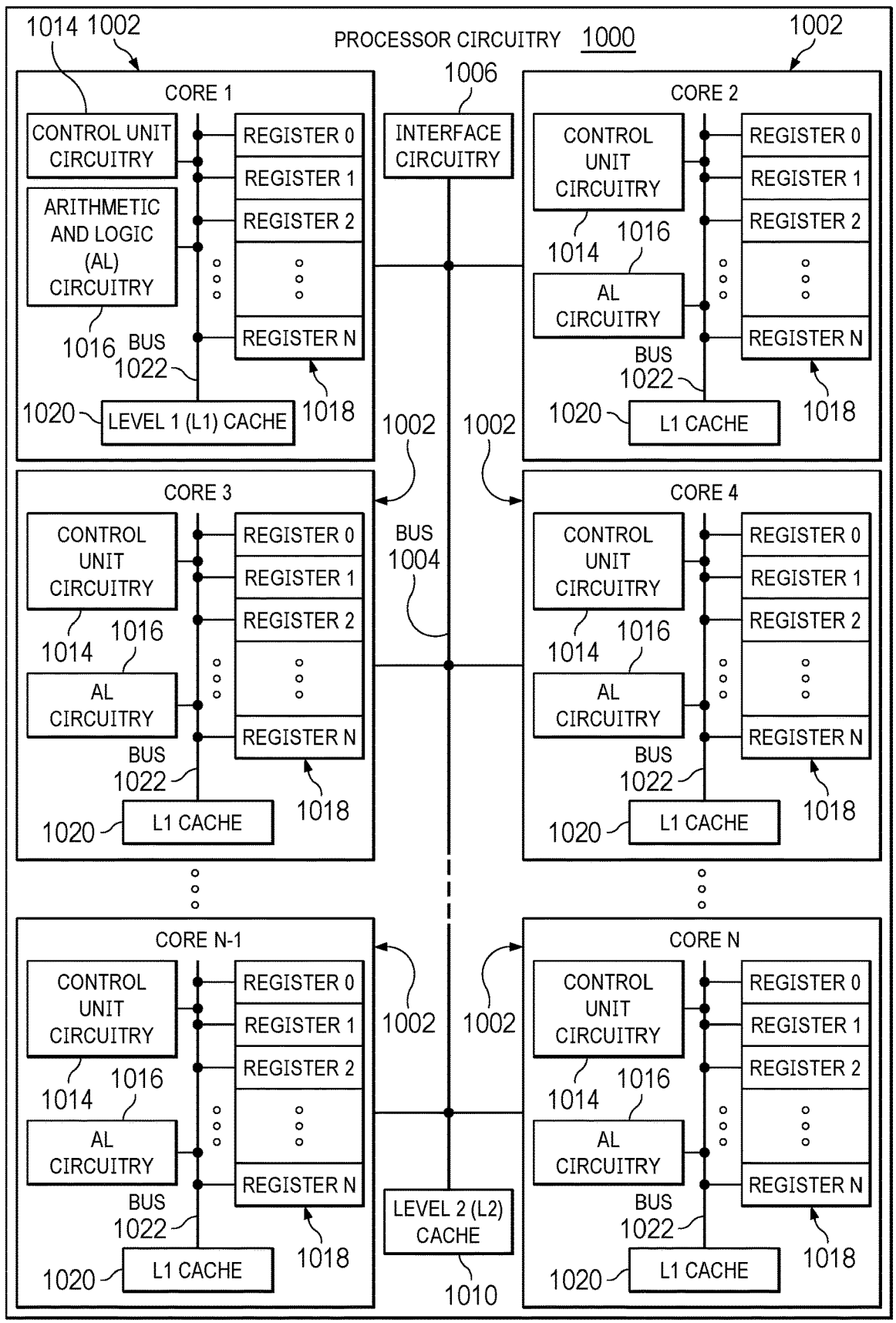
FIG. 10 is a block diagram of an example implementation of the processor circuitry of FIGS. 8 and/or 9.

FIG. 10 is a block diagram of an example implementation of the processor circuitry 812 of FIG. 8 and/or the processor circuitry 912 of FIG. 9. In this example, the processor circuitry 812 of FIG. 8 and/or the processor circuitry 912 of FIG. 9 is implemented by a microprocessor 1000. For example, the microprocessor 1000 may be a general purpose microprocessor (e.g., general purpose microprocessor circuitry). The microprocessor 1000 executes some or all of the machine readable instructions of the flowcharts of FIGS. 4-6 to effectively instantiate the circuitry of FIG. 3 as logic circuits to perform the operations corresponding to those machine readable instructions. In some such examples, the circuitry of FIG. 3 is instantiated by the hardware circuits of the microprocessor 1000 in combination with the instructions. For example, the microprocessor 1000 may implement multi-core hardware circuitry such as a CPU, a DSP, a GPU, an XPU, etc. Although it may include any number of example cores 1002 (e.g., 1 core), the microprocessor 1000 of this example is a multi-core semiconductor device including N cores. The cores 1002 of the microprocessor 1000 may operate independently or may cooperate to execute machine readable instructions. For example, machine code corresponding to a firmware program, an embedded software program, or a software program may be executed by one of the cores 1002 or may be executed by multiple ones of the cores 1002 at the same or different times. In some examples, the machine code corresponding to the firmware program, the embedded software program, or the software program is split into threads and executed in parallel by two or more of the cores 1002. The software program may correspond to a portion or all of the machine readable instructions and/or operations represented by the flowcharts of FIGS. 4-6.

The cores 1002 may communicate by a first example bus 1004. In some examples, the first bus 1004 may implement a communication bus to effectuate communication associated with one(s) of the cores 1002. For example, the first bus 1004 may implement at least one of an I2C bus, a SPI bus, a PCI bus, or a PCIe bus. Additionally or alternatively, the first bus 1004 may implement any other type of computing or electrical bus. The cores 1002 may obtain data, instructions, and/or signals from one or more external devices by example interface circuitry 1006. The cores 1002 may output data, instructions, and/or signals to the one or more external devices by the interface circuitry 1006. Although the cores 1002 of this example include example local memory 1020 (e.g., Level 1 (L1) cache that may be split into an L1 data cache and an L1 instruction cache), the microprocessor 1000 also includes example shared memory 1010 that may be shared by the cores (e.g., Level 2 (L2_ cache)) for high-speed access to data and/or instructions. Data and/or instructions may be transferred (e.g., shared) by writing to and/or reading from the shared memory 1010. The local memory 1020 of each of the cores 1002 and the shared memory 1010 may be part of a hierarchy of storage devices including multiple levels of cache memory and the main memory (e.g., the main memory 814, 816 of FIG. 8 and/or the main memory 914, 916 of FIG. 9). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1002 may be referred to as a CPU, DSP, GPU, etc., or any other type of hardware circuitry. Each core 1002 includes control unit circuitry 1014, arithmetic and logic (AL) circuitry 1016 (sometimes referred to as an ALU circuitry), a plurality of registers 1018, the L1 cache 1020, and a second example bus 1022. Other structures may be present. For example, each core 1002 may include vector unit circuitry, single instruction multiple data (SIMD) unit circuitry, load/store unit (LSU) circuitry, branch/jump unit circuitry, floating-point unit (FPU) circuitry, etc. The control unit circuitry 1014 includes semiconductor-based circuits structured to control (e.g., coordinate) data movement within the corresponding core 1002. The AL circuitry 1016 includes semiconductor-based circuits structured to perform one or more mathematic and/or logic operations on the data within the corresponding core 1002. The AL circuitry 1016 of some examples performs integer based operations. In other examples, the AL circuitry 1016 also performs floating point operations. In yet other examples, the AL circuitry 1016 may include first AL circuitry that performs integer based operations and second AL circuitry that performs floating point operations. In some examples, the AL circuitry 1016 may be referred to as an Arithmetic Logic Unit (ALU). The registers 1018 are semiconductor-based structures to store data and/or instructions such as results of one or more of the operations performed by the AL circuitry 1016 of the corresponding core 1002. For example, the registers 1018 may include vector register(s), SIMD register(s), general purpose register(s), flag register(s), segment register(s), machine specific register(s), instruction pointer register(s), control register(s), debug register(s), memory management register(s), machine check register(s), etc. The registers 1018 may be arranged in a bank as shown in FIG. 10. Alternatively, the registers 1018 may be organized in any other arrangement, format, or structure including distributed throughout the core 1002 to shorten access time. The second bus 1022 may implement at least one of an I2C bus, a SPI bus, a PCI bus, a PCIe bus, or an Advanced High-performance Bus (AHB) according to the AHB protocol published in the Advanced Microcontroller Bus Architecture. Additionally or alternatively, the second bus 1022 may implement any other type of computing or electrical bus.

Each core 1002 and/or, more generally, the microprocessor 1000 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1000 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 11:
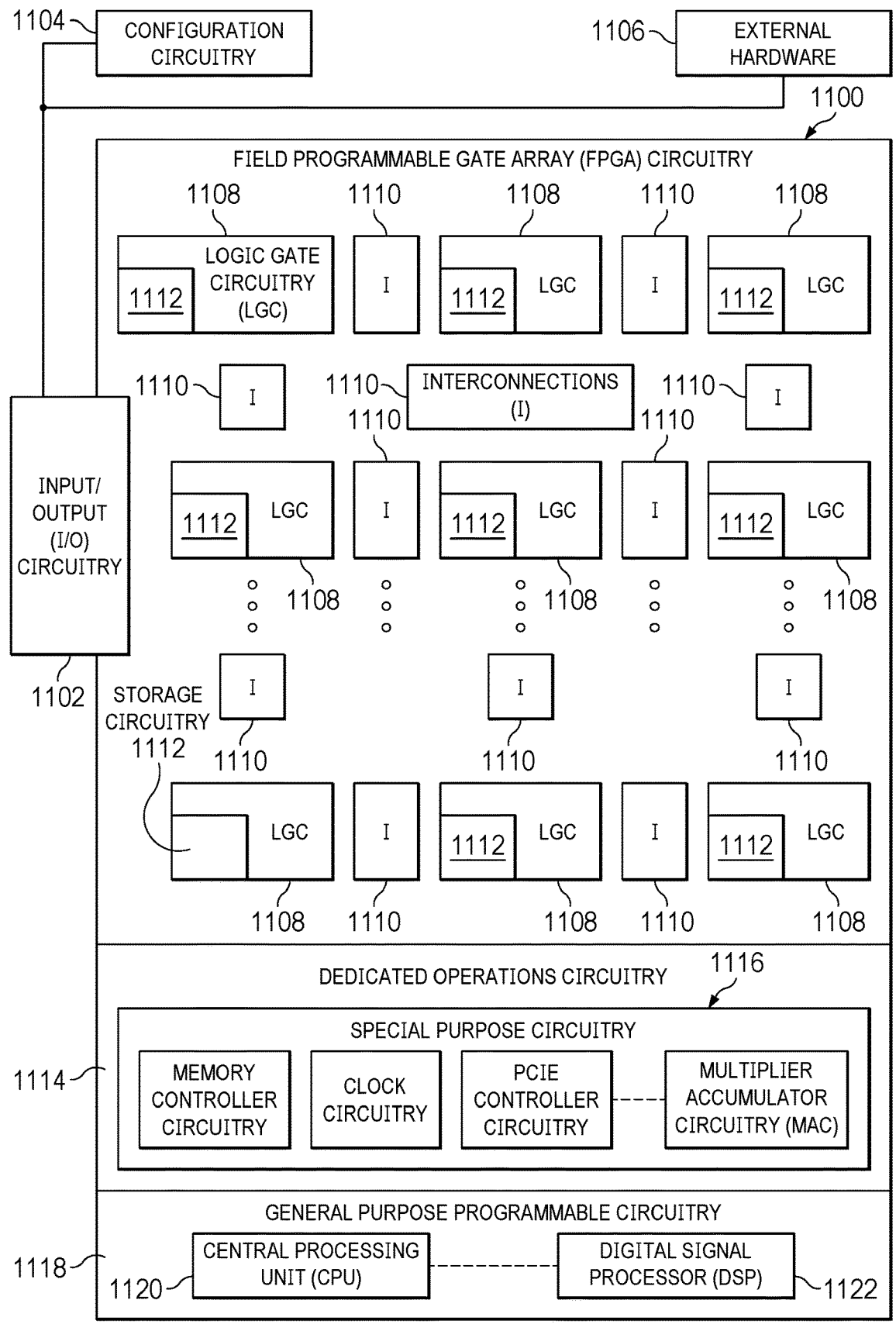
FIG. 11 is a block diagram of another example implementation of the processor circuitry of FIGS. 8 and/or 9.

FIG. 11 is a block diagram of another example implementation of the processor circuitry 812 of FIG. 8 and/or the processor circuitry 912 of FIG. 9. In this example, the processor circuitry 812, 912 is implemented by FPGA circuitry 1100. For example, the FPGA circuitry 1100 may be implemented by an FPGA. The FPGA circuitry 1100 can be used, for example, to perform operations that could otherwise be performed by the example microprocessor 1000 of FIG. 10 executing corresponding machine readable instructions. However, once configured, the FPGA circuitry 1100 instantiates the machine readable instructions in hardware and, thus, can often execute the operations faster than they could be performed by a general purpose microprocessor executing the corresponding software.

More specifically, in contrast to the microprocessor 1000 of FIG. 10 described above (which is a general purpose device that may be programmed to execute some or all of the machine readable instructions represented by the flowcharts of FIGS. 4-6 but whose interconnections and logic circuitry are fixed once fabricated), the FPGA circuitry 1100 of the example of FIG. 11 includes interconnections and logic circuitry that may be configured and/or interconnected in different ways after fabrication to instantiate, for example, some or all of the machine readable instructions represented by the flowcharts of FIGS. 4-6. In particular, the FPGA circuitry 1100 may be thought of as an array of logic gates, interconnections, and switches. The switches can be programmed to change how the logic gates are interconnected by the interconnections, effectively forming one or more dedicated logic circuits (unless and until the FPGA circuitry 1100 is reprogrammed). The configured logic circuits enable the logic gates to cooperate in different ways to perform different operations on data received by input circuitry. Those operations may correspond to some or all of the software represented by the flowcharts of FIGS. 4-6. As such, the FPGA circuitry 1100 may be structured to effectively instantiate some or all of the machine readable instructions of the flowcharts of FIGS. 4-6 as dedicated logic circuits to perform the operations corresponding to those software instructions in a dedicated manner analogous to an ASIC. Therefore, the FPGA circuitry 1100 may perform the operations corresponding to the some or all of the machine readable instructions of FIGS. 4-6 faster than the general purpose microprocessor can execute the same.

In the example of FIG. 11, the FPGA circuitry 1100 is structured to be programmed (and/or reprogrammed one or more times) by an end user by a hardware description language (HDL) such as Verilog. The FPGA circuitry 1100 of FIG. 11, includes example input/output (I/O) circuitry 1102 to obtain and/or output data to/from example configuration circuitry 1104 and/or external hardware 1106. For example, the configuration circuitry 1104 may be implemented by interface circuitry that may obtain machine readable instructions to configure the FPGA circuitry 1100, or portion(s) thereof. In some such examples, the configuration circuitry 1104 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1106 may be implemented by external hardware circuitry. For example, the external hardware 1106 may be implemented by the microprocessor 1000 of FIG. 10. The FPGA circuitry 1100 also includes an array of example logic gate circuitry 1108, a plurality of example configurable interconnections 1110, and example storage circuitry 1112. The logic gate circuitry 1108 and the configurable interconnections 1110 are configurable to instantiate one or more operations that may correspond to at least some of the machine readable instructions represented by the processes of FIGS. 4-6 and/or other desired operations. The logic gate circuitry 1108 shown in FIG. 11 is fabricated in groups or blocks. Each block includes semiconductor-based electrical structures that may be configured into logic circuits. In some examples, the electrical structures include logic gates (e.g., AND gates, OR gates, NOR gates, etc.) that provide basic building blocks for logic circuits. Electrically controllable switches (e.g., transistors) are present within each of the logic gate circuitry 1108 to enable configuration of the electrical structures and/or the logic gates to form circuits to perform desired operations. The logic gate circuitry 1108 may include other electrical structures such as look-up tables (LUTs), registers (e.g., flip-flops or latches), multiplexers, etc.

The configurable interconnections 1110 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1108 to program desired logic circuits.

The storage circuitry 1112 of the illustrated example is structured to store result(s) of the one or more of the operations performed by corresponding logic gates. The storage circuitry 1112 may be implemented by registers or the like. In the illustrated example, the storage circuitry 1112 is distributed amongst the logic gate circuitry 1108 to facilitate access and increase execution speed.

The example FPGA circuitry 1100 of FIG. 11 also includes example Dedicated Operations Circuitry 1114. In this example, the Dedicated Operations Circuitry 1114 includes special purpose circuitry 1116 that may be invoked to implement commonly used functions to avoid the need to program those functions in the field. Examples of such special purpose circuitry 1116 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1100 may also include example general purpose programmable circuitry 1118 such as an example CPU 1120 and/or an example DSP 1122. Other general purpose programmable circuitry 1118 may additionally or alternatively be present such as a GPU, an XPU, etc., that can be programmed to perform other operations.

Although FIGS. 10 and 11 illustrate two example implementations of the processor circuitry 812 of FIG. 8 and/or the processor circuitry 912 of FIG. 9, many other approaches are contemplated. For example, as mentioned above, modern FPGA circuitry may include an on-board CPU, such as one or more of the example CPU 1120 of FIG. 11. Therefore, the processor circuitry 812 of FIG. 8 and/or the processor circuitry 912 of FIG. 9 may additionally be implemented by combining the example microprocessor 1000 of FIG. 10 and the example FPGA circuitry 1100 of FIG. 11. In some such hybrid examples, a first portion of the machine readable instructions represented by the flowcharts of FIGS. 4-6 may be executed by one or more of the cores 1002 of FIG. 10, a second portion of the machine readable instructions represented by the flowcharts of FIGS. 4-6 may be executed by the FPGA circuitry 1100 of FIG. 11, and/or a third portion of the machine readable instructions represented by the flowcharts of FIGS. 4-6 may be executed by an ASIC. It should be understood that some or all of the circuitry of FIG. 3 may, thus, be instantiated at the same or different times. Some or all of the circuitry may be instantiated, for example, in one or more threads executing concurrently and/or in series. Moreover, in some examples, some or all of the circuitry of FIG. 3 may be implemented within one or more virtual machines and/or containers executing on the microprocessor.

In some examples, the example microprocessor 1000 of FIG. 10 and the example FPGA circuitry 1100 of FIG. 11 may be in one or more packages. For example, the example microprocessor 1000 of FIG. 10 and the example FPGA circuitry 1100 of FIG. 11 may be in one or more packages. In some examples, an XPU may be implemented by the example microprocessor 1000 of FIG. 10 and the example FPGA circuitry 1100 of FIG. 11, which may be in one or more packages. For example, the XPU may include a CPU in one package, a DSP in another package, a GPU in yet another package, and an FPGA in still yet another package.

Figure 12:
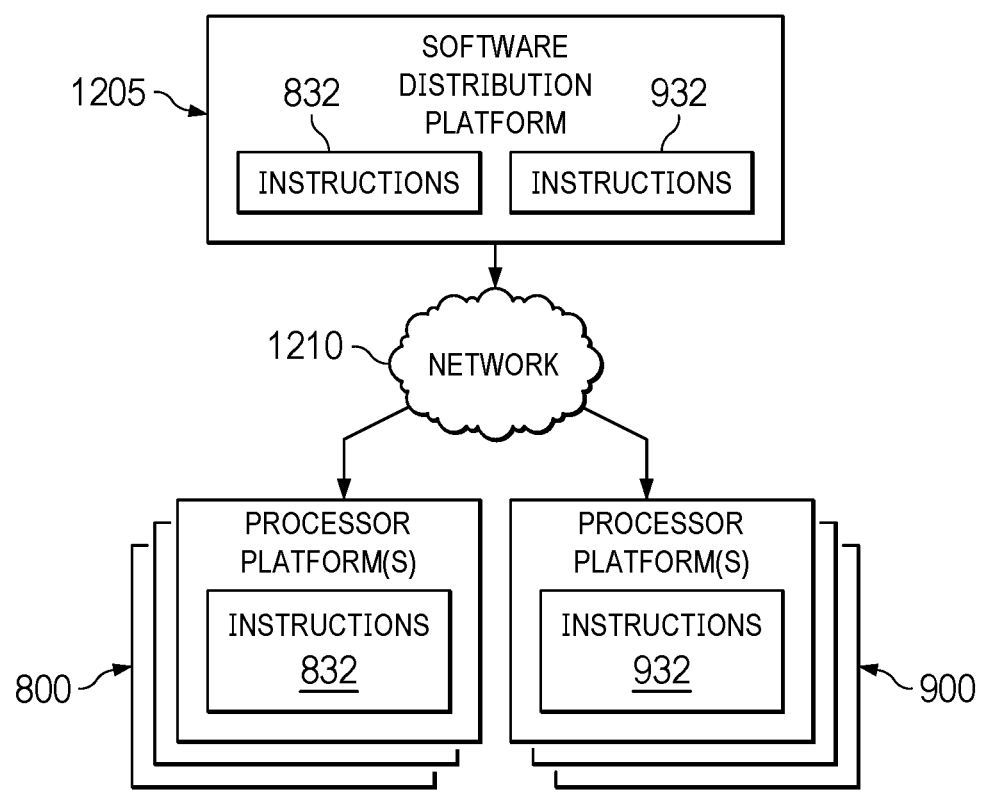
FIG. 12 is a block diagram of an example software distribution platform (e.g., one or more servers) to distribute software (e.g., software corresponding to the example machine readable instructions of FIGS. 4-6) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1205 to distribute software such as the example machine readable instructions 832 of FIG. 8 and/or the example machine readable instructions 932 of FIG. 9 to hardware devices owned and/or operated by third parties is illustrated in FIG. 12. The example software distribution platform 1205 may be implemented by any computer server, data facility, cloud service, etc., capable of storing and transmitting software to other computing devices. The third parties may be customers of the entity owning and/or operating the software distribution platform 1205. For example, the entity that owns and/or operates the software distribution platform 1205 may be a developer, a seller, and/or a licensor of software such as the example machine readable instructions 832 of FIG. 8 and/or the example machine readable instructions 932 of FIG. 9. The third parties may be consumers, users, retailers, OEMs, etc., who purchase and/or license the software for use and/or re-sale and/or sub-licensing. In the illustrated example, the software distribution platform 1205 includes one or more servers and one or more storage devices. The storage devices store the machine readable instructions 832 of FIG. 8 and/or the example machine readable instructions 932 of FIG. 9, which may correspond to the example processes 400, 500, 600 of FIGS. 4-6, as described above. The one or more servers of the example software distribution platform 1205 are in communication with an example network 1210, which may correspond to any one or more of the Internet and/or any of the example networks 826, 926 described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 832 of FIG. 8 and/or the example machine readable instructions 932 of FIG. 9 from the software distribution platform 1205. For example, the software, which may correspond to the example processes 400, 500, 600 of FIGS. 4-6, may be downloaded to the example processor platform 800 of FIG. 8, which is to execute the machine readable instructions 832 to implement the wireless battery management control circuitry 302 of FIG. 3 and/or the example processor platform 900 of FIG. 9, which is to execute the machine readable instructions 932 to implement the example battery circuitry 304A-H of FIG. 3. In some examples, one or more servers of the software distribution platform 1205 periodically offer, transmit, and/or force updates to the software (e.g., the example machine readable instructions 832 of FIG. 8 and/or the example machine readable instructions 932 of FIG. 9) to ensure improvements, patches, updates, etc., are distributed and applied to the software at the end user devices.

From the foregoing, it will be appreciated that example systems, methods, apparatus, and articles of manufacture have been disclosed that improve one-hop extension in wireless battery management systems. For example, disclosed systems, methods, apparatus, and articles of manufacture advantageously instruct intermediate battery circuitry to forward downlink communication(s) to noncommunicative battery circuitry before the repeater battery circuitry processes the downlink communication(s). Additionally, for example, the example downlink communication(s) specify(ies) a time at which noncommunicative battery circuitry is to make a measurement of a corresponding battery. The specified time may be based on the time at which transmission of the downlink communication(s) to the noncommunicative battery circuitry is expected to be completed. Disclosed systems, methods, apparatus, and articles of manufacture improve the efficiency of using a computing device by enabling synchronization (e.g., measurement synchronization) in wireless battery management systems despite noncommunicative battery circuitry. Disclosed systems, methods, apparatus, and articles of manufacture are accordingly directed to one or more improvement(s) in the operation of a machine such as a computer or other electronic and/or mechanical device.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus comprising:
   at least one memory;
   machine readable instructions; and
   processor circuitry to at least one of instantiate or execute the machine readable instructions to:
   cause transmission of an instruction to a first battery monitoring node (BMN) of a vehicle, the first BMN in communication with the apparatus, the instruction to cause the first BMN to operate as a repeater for a second BMN of the vehicle, the second BMN noncommunicative with the apparatus;
   process an acknowledgement from the first BMN, the acknowledgement indicating that the first BMN has configured to operate as the repeater; and
   cause transmission of a communication to at least the first BMN, the communication indicating a time at which at least the first BMN is to perform a first action associated with a first battery of the vehicle and the second BMN is to perform a second action associated with a second battery of the vehicle.

2. The apparatus of claim 1, wherein the processor circuitry is to select the first BMN to operate as the repeater based on at least one of a first received signal strength indicator (RSSI) of a first signal received by the apparatus from the first BMN or a second RSSI of a second signal received by the second BMN from the first BMN.

3. The apparatus of claim 1, wherein the communication is a first communication, and prior to operation of a wireless battery management system (WBMS) including the first BMN and the second BMN, the processor circuitry is to detect that the second BMN is noncommunicative with the apparatus based on data representative of a total number of BMNs in the WBMS and failure of the second BMN to respond to a second communication from the apparatus.

4. The apparatus of claim 1, wherein during operation of a wireless battery management system including the first BMN and the second BMN, the processor circuitry is to detect that the second BMN is noncommunicative with the apparatus based on (1) a determination that the second BMN is no longer in communication with the apparatus and (2) failure of the second BMN to reestablish communication with the apparatus.

5. The apparatus of claim 1, wherein the communication is a first communication, and the processor circuitry is to process a second communication from the first BMN and a third communication from the first BMN, the second communication indicating a first result of the first action associated with the first battery, the third communication indicating a second result of the second action associated with the second battery.

6. The apparatus of claim 1, wherein the communication is a first communication, and the processor circuitry is to process a second communication from the first BMN, the second communication indicating a first result of the first action associated with the first battery and a second result of the second action associated with the second battery.

7. The apparatus of claim 1, wherein the second BMN is noncommunicative with the apparatus due to at least one of (1) radio frequency (RF) circuitry of the second BMN being damaged, (2) an antenna of the RF circuitry being misconfigured, (3) interference between the second BMN and the apparatus, or (4) degradation of at least one of the RF circuitry or the second BMN over a period of time.

8. Wireless battery management control circuitry comprising:
wireless battery control circuitry to generate a communication indicating a time at which at least a first battery monitoring node (BMN) of a vehicle is to perform a first action associated with a first battery of the vehicle and a second BMN of the vehicle is to perform a second action associated with a second battery of the vehicle; and
wireless battery communication circuitry coupled to the wireless battery control circuitry, the wireless battery communication circuitry to:
transmit an instruction to the first BMN, the instruction to cause the first BMN to operate as a repeater for the second BMN, the second BMN noncommunicative with the wireless battery communication circuitry;
receive an acknowledgement from the first BMN, the acknowledgement indicating that the first BMN has configured to operate as the repeater; and
transmit the communication to at least the first BMN.

9. The wireless battery management control circuitry of claim 8, wherein the wireless battery control circuitry is to select the first BMN to operate as the repeater based on at least one of a first received signal strength indicator (RSSI) of a first signal received by the wireless battery communication circuitry from the first BMN or a second RSSI of a second signal received by the second BMN from the first BMN.

10. The wireless battery management control circuitry of claim 8, wherein the communication is a first communication, and prior to operation of a wireless battery management system (WBMS) including the first BMN and the second BMN, the wireless battery control circuitry is to detect that the second BMN is noncommunicative with the wireless battery communication circuitry based on data representative of a total number of BMNs in the WBMS and failure of the second BMN to respond to a second communication from the wireless battery communication circuitry.

11. The wireless battery management control circuitry of claim 8, wherein during operation of a wireless battery management system including the first BMN and the second BMN, the wireless battery control circuitry is to detect that the second BMN is noncommunicative with the wireless battery communication circuitry based on (1) a determination that the second BMN is no longer in communication with the wireless battery communication circuitry and (2) failure of the second BMN to reestablish communication with the wireless battery communication circuitry.

12. The wireless battery management control circuitry of claim 8, wherein the communication is a first communication, and the wireless battery communication circuitry is to receive a second communication from the first BMN and a third communication from the first BMN, the second communication indicating a first result of the first action associated with the first battery, the third communication indicating a second result of the second action associated with the second battery.

13. The wireless battery management control circuitry of claim 8, wherein the communication is a first communication, and the wireless battery communication circuitry is to receive a second communication from the first BMN, the second communication indicating a first result of the first action associated with the first battery and a second result of the second action associated with the second battery.

14. The wireless battery management control circuitry of claim 8, wherein the second BMN is noncommunicative with the wireless battery communication circuitry due to at least one of (1) radio frequency (RF) circuitry of the second BMN being damaged, (2) an antenna of the RF circuitry being misconfigured, (3) interference between the second BMN and the wireless battery communication circuitry, or (4) degradation of at least one of the RF circuitry or the second BMN over a period of time.

15. A method comprising:
transmitting, with wireless battery communication circuitry, an instruction to a first battery monitoring node (BMN) of a vehicle, the first BMN in communication with the wireless battery communication circuitry, the instruction to cause the first BMN to operate as a repeater for a second BMN of the vehicle, the second BMN noncommunicative with the wireless battery communication circuitry;
receiving, with the wireless battery communication circuitry, an acknowledgement from the first BMN, the acknowledgement indicating that the first BMN has configured to operate as the repeater; and
transmitting, with the wireless battery communication circuitry, a communication to at least the first BMN, the communication indicating a time at which at least the first BMN is to perform a first action associated with a first battery of the vehicle and the second BMN is to perform a second action associated with a second battery of the vehicle.

16. The method of claim 15, further including selecting the first BMN to operate as the repeater based on at least one of a first received signal strength indicator (RSSI) of a first signal received by the wireless battery communication circuitry from the first BMN or a second RSSI of a second signal received by the second BMN from the first BMN.

17. The method of claim 15, wherein the communication is a first communication, and the method further includes, prior to operation of a wireless battery management system (WBMS) including the first BMN and the second BMN, detecting that the second BMN is noncommunicative with the wireless battery communication circuitry based on data representative of a total number of BMNs in the WBMS and failure of the second BMN to respond to a second communication from the wireless battery communication circuitry.

18. The method of claim 15, further including, during operation of a wireless battery management system including the first BMN and the second BMN, detecting that the second BMN is noncommunicative with the wireless battery communication circuitry based on (1) a determination that the second BMN is no longer in communication with the wireless battery communication circuitry and (2) failure of the second BMN to reestablish communication with the wireless battery communication circuitry.

19. The method of claim 15, the communication is a first communication, and the method further includes receiving a second communication from the first BMN and a third communication from the first BMN, the second communication indicating a first result of the first action associated with the first battery, the third communication indicating a second result of the second action associated with the second battery.

20. The method of claim 15, wherein the communication is a first communication, and the method further includes receiving a second communication from the first BMN, the second communication indicating a first result of the first action associated with the first battery and a second result of the second action associated with the second battery.

21. The method of claim 15, wherein the second BMN is noncommunicative with the wireless battery communication circuitry due to at least one of (1) radio frequency (RF) circuitry of the second BMN being damaged, (2) an antenna of the RF circuitry being misconfigured, (3) interference between the second BMN and the wireless battery communication circuitry, or (4) degradation of at least one of the RF circuitry or the second BMN over a period of time.

\* \* \* \* \*